US012796243B2

(12) United States Patent
Lee

(10) Patent No.: US 12,796,243 B2
(45) Date of Patent: Nov. 10, 2026

(54) DISPLAY APPARATUS

(71) Applicant: SAMSUNG DISPLAY CO., LTD., Yongin-si (KR)

(72) Inventor: Kyeuk Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 765 days.

(21) Appl. No.: 17/894,435

(22) Filed: Aug. 24, 2022

(65) Prior Publication Data

US 2023/0172011 A1 Jun. 1, 2023

(30) Foreign Application Priority Data

Nov. 5, 2021 (KR) ........................ 10-2021-0151667

(51) Int. Cl.

*H10K 59/131* (2023.01)
*H10K 59/126* (2023.01)
*H10K 59/38* (2023.01)
*H10K 59/80* (2023.01)

(52) U.S. Cl.

CPC ......... *H10K 59/126* (2023.02); *H10K 59/131* (2023.02); *H10K 59/38* (2023.02); *H10K 59/8722* (2023.02)

(58) Field of Classification Search

CPC ........... G02F 1/136204; H01L 23/3142; H01L 23/02–10; H01L 23/60–62; H10K 59/8722; H10K 59/10–221; H10K 50/87; H10K 50/841–8428; H01D 89/921; H10D 86/441; H10D 86/60; G09G 2300/0413; G09G 2330/04–045; H05B 33/04

See application file for complete search history.

(56) References Cited

U.S. PATENT DOCUMENTS

| | | | | |
|---|---|---|---|---|
| 9,312,509 | B2 | 4/2016 | Kwak | |
| 10,096,794 | B2 | 10/2018 | An | |
| 11,227,843 | B2 | 1/2022 | Park et al. | |
| 2011/0102308 | A1* | 5/2011 | Nakamura | H10F 39/80 345/84 |
| 2014/0332769 | A1* | 11/2014 | Lee | H10K 59/126 257/40 |
| 2015/0380474 | A1* | 12/2015 | Lee | H10K 59/8792 257/40 |
| 2017/0277320 | A1* | 9/2017 | Choi | G06F 3/0446 |

(Continued)

FOREIGN PATENT DOCUMENTS

| | | | |
|---|---|---|---|
| KR | 1020170008359 | A | 1/2017 |
| KR | 20200030161 | A | 3/2020 |

(Continued)

*Primary Examiner* — Steven B Gauthier
*Assistant Examiner* — Adam D Weiland
(74) *Attorney, Agent, or Firm* — CANTOR COLBURN LLP

(57) ABSTRACT

A display apparatus includes a display area and a peripheral area located outside the display area, and further includes: a substrate, a plurality of first metal patterns arranged on the substrate along an edge of the substrate and arranged apart from each other in the peripheral area, an insulating layer disposed on the plurality of first metal patterns, and a common power supply layer disposed on the insulating layer in the peripheral area and electrically connected to the plurality of first metal patterns via a first contact hole defined in the insulating layer.

24 Claims, 14 Drawing Sheets

(56) References Cited

U.S. PATENT DOCUMENTS

| | | | | |
|---|---|---|---|---|
| 2020/0083474 | A1 | 3/2020 | Lee et al. | |
| 2020/0226983 | A1 | 7/2020 | Lee | |
| 2020/0227509 | A1 | 7/2020 | Yoon et al. | |
| 2020/0295310 | A1 * | 9/2020 | Moon | H10K 59/38 |
| 2020/0326586 | A1 | 10/2020 | Kim et al. | |
| 2020/0381508 | A1 * | 12/2020 | Jeon | H10K 59/38 |
| 2021/0208457 | A1 * | 7/2021 | Son | G02F 1/1339 |

FOREIGN PATENT DOCUMENTS

| | | | |
|---|---|---|---|
| KR | 102135882 | B1 | 7/2020 |
| KR | 20200088940 | A | 7/2020 |
| KR | 1020200087924 | A | 7/2020 |
| KR | 20200110505 | A | 9/2020 |
| KR | 20200120793 | A | 10/2020 |
| KR | 1020200118316 | A | 10/2020 |

* cited by examiner

DISPLAY APPARATUS

This application claims priority to Korean Patent Application No. 10-2021-0151667 filed on Nov. 5, 2021, and all the benefits accruing therefrom under 35 U.S.C. § 119, the content of which in its entirety is herein incorporated by reference.

BACKGROUND

1. Field

One or more embodiments relate to display apparatuses, and more particularly, to display apparatuses with strong resistance against static electricity.

2. Description of the Related Art

A display apparatus, which is used as a display screen not only for a portable electronic device such as smart phones or tablet personal computers ("PC"), but also for various products such as televisions, monitors, or billboards, are increasingly prone to external static electricity flowing thereinto. Furthermore, the electrostatic sensitivity of electric elements or circuits provided in the display apparatus has increased.

SUMMARY

A display apparatus according to the related art has a problem in that light-emitting elements or pixel circuits may be damaged because static electricity generated during manufacturing or use of a display apparatus flows into a display area, which causes a defect in the display apparatus.

One or more embodiments include display apparatuses capable of effectively discharging or distributing static electricity. However, such an aspect is merely exemplary, and the scope of the present disclosure is not limited thereby.

Additional aspects will be set forth in part in the description which follows and, in part, will be apparent from the description, or may be learned by practice of the presented embodiments.

According to one or more embodiments, in a display apparatus including a display area and a peripheral area located outside the display area, the display apparatus includes: a substrate, a plurality of first metal patterns arranged on the substrate along an edge of the substrate and arranged apart from each other in the peripheral area, an insulating layer disposed on the plurality of first metal patterns, and a common power supply layer disposed on the insulating layer in the peripheral area and electrically connected to the plurality of first metal patterns via a first contact hole defined in the insulating layer.

According to an embodiment, each of the plurality of first metal patterns may include a plurality of slits.

According to an embodiment, each of the plurality of first metal patterns may have a width along the edge of the substrate and a length along a direction crossing the edge, and the length of each of the plurality of first metal patterns may be greater than the width thereof.

According to an embodiment, the plurality of first metal patterns may surround at least part of the display area, in a plan view.

According to an embodiment, the display apparatus may further include: a thin film transistor disposed on the substrate in the display area and including a semiconductor layer and a gate electrode overlapping the semiconductor layer; and a bottom metal layer interposed between the substrate and the thin film transistor.

According to an embodiment, the plurality of first metal patterns may be arranged apart from each other in the same layer as the bottom metal layer, and may include the same material as the bottom metal layer.

According to an embodiment, the plurality of first metal patterns may be arranged apart from each other in the same layer as the gate electrode, and may include the same material as the gate electrode.

According to an embodiment, the display apparatus may further include a plurality of second metal patterns disposed on the plurality of first metal patterns and located in the peripheral area, where the plurality of first metal patterns are arranged apart from each other in the same layer as the bottom metal layer and include the same material as the bottom metal layer, and the plurality of second metal patterns are arranged apart from each other in the same layer as the gate electrode and include the same material as the gate electrode.

According to an embodiment, the plurality of second metal patterns may be electrically connected to the common power supply layer via a second contact hole defined in the insulating layer.

According to an embodiment, the display apparatus may further include a pixel electrode disposed on the substrate and located in the display area, a counter electrode on the pixel electrode, and an intermediate layer between the pixel electrode and the counter electrode, where the counter electrode is electrically connected to the common power supply layer, and the insulating layer includes an inorganic insulating material.

According to an embodiment, the display apparatus may further include an encapsulation substrate arranged to face the substrate, and a sealant located in the peripheral area, interposed between the substrate and the encapsulation substrate, and including an inner surface facing the display area and an outer surface that is opposite to the inner surface.

According to an embodiment, each of the plurality of first metal patterns may protrude outward beyond the outer surface of the sealant in a plan view.

According to an embodiment, the first contact hole may be located closer to the display area than the outer surface of the sealant, in a plan view.

According to an embodiment, an edge of the common power supply layer may be located closer to the display area than the outer surface of the sealant, in a plan view.

According to an embodiment, the display apparatus may further include a plurality of second metal patterns disposed below the insulating layer in a layer different from the plurality of first metal patterns, where the common power supply layer is electrically connected to the plurality of second metal patterns via a second contact hole defined in the insulating layer, and the second contact hole is located closer to the display area than the outer surface of the sealant, in a plan view.

According to an embodiment, the display apparatus may further include an encapsulation layer covering the display area and including at least one inorganic encapsulation layer and at least one organic encapsulation layer.

According to an embodiment, each of the plurality of first metal patterns may protrude outward beyond an edge of the at least one inorganic encapsulation layer, in a plan view.

According to an embodiment, the at least one inorganic encapsulation layer of the encapsulation layer may extend from the display area to the peripheral area and may cover an entirety of the common power supply layer, in a plan view.

According to an embodiment, the first contact hole may be located closer to the display area than an edge of the at least one inorganic encapsulation layer, in a plan view.

According to an embodiment, the display apparatus may further include a plurality of second metal patterns disposed in a layer different from the plurality of first metal patterns and below the insulating layer, where the common power supply layer is electrically connected to the plurality of second metal patterns via a second contact hole defined in the insulating layer, and the second contact hole is located closer to the display area than an edge of the at least one inorganic encapsulation layer, in a plan view.

According to an embodiment, the display apparatus may further include an organic light-emitting device disposed on the substrate and including a pixel electrode, a counter electrode on the pixel electrode, and an intermediate layer between the pixel electrode and the counter electrode, an encapsulation layer covering the organic light-emitting device and including at least one inorganic encapsulation layer and at least one organic encapsulation layer, an encapsulation substrate arranged to face the substrate, a quantum-dot layer on one surface of the encapsulation substrate to face the pixel electrode, and a sealant located in the peripheral area, interposed between the substrate and the encapsulation substrate, and including an inner surface facing the display area and an outer surface that is opposite to the inner surface.

According to an embodiment, the at least one inorganic encapsulation layer may be located closer to the display area than the sealant to be apart from the sealant, and each of the plurality of first metal patterns protrudes outward beyond the outer surface of the sealant, in a plan view.

According to an embodiment, an edge of the common power supply layer may be located closer to the display area than the outer surface of the sealant, and located farther from the display area than an edge of the at least one inorganic encapsulation layer, in a plan view.

According to an embodiment, an edge of the common power supply layer may be located closer to the display area than the outer surface of the sealant, and located closer to the display area than an edge of the at least one inorganic encapsulation layer.

According to one or more embodiments, a display apparatus includes: a substrate including a plurality of pixels, a plurality of first metal patterns arranged apart from each other on the substrate along an edge of the substrate, a common power supply layer electrically connected to the plurality of first metal patterns via a first contact hole and which applies a constant voltage to the plurality of pixels, an encapsulation substrate arranged to face the substrate, and a sealant disposed between the substrate and the encapsulation substrate to surround the plurality of pixels, and including an outer surface close to an edge of the substrate and an inner surface close to the plurality of pixels, where end portions of the first metal patterns are arranged to be closer to the edge of the substrate than an outer surface of the sealant, and the first contact hole is disposed between the outer surface and the inner surface of the sealant.

Other aspects, features, and advantages than those described above will become apparent from the following drawings, claims, and detailed descriptions to embody the disclosure below.

These general and specific embodiments may be implemented by using a system, a method, a computer program, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
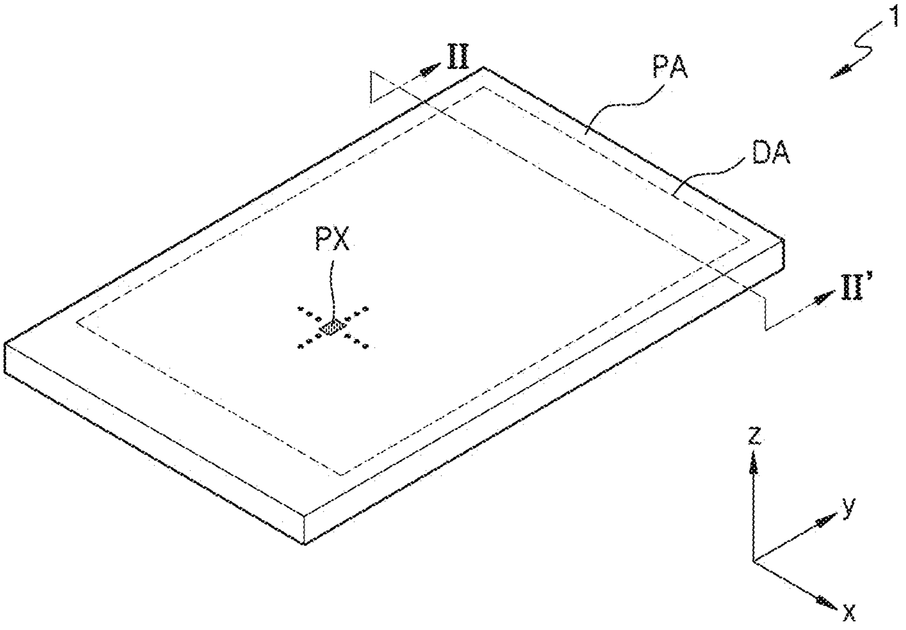
FIG. 1 is a schematic perspective view of a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, exemplary embodiments will be described in detail with reference to the accompanying drawings, and in the description with reference to the drawings, the same or corresponding constituents are indicated by the same reference numerals and redundant descriptions thereof are omitted.

In the following embodiments, it will be understood that although the terms "first," "second," etc. may be used herein to describe various components, these components should not be limited by these terms, and these components are only used to distinguish one component from another.

In the following embodiments, the singular forms "a," "an," and "the" are intended to include the plural forms as well, unless the context clearly indicates otherwise.

In the following embodiments, it will be further understood that the terms "comprises" and/or "comprising" used herein specify the presence of stated features or components, but do not preclude the presence or addition of one or more other features or components.

In the following embodiments, it will be understood that when a layer, region, or component is referred to as being "formed on" another layer, region, or component, it can be directly or indirectly formed on the other layer, region, or component, and, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the expression such as "A and/or B" may include A, B, or A and B. The expression such as "at least one of A and B" may include A, B, or A and B.

In the following embodiments, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a display apparatus 1 according to one or more embodiments. As used herein, the "plan view" is a view in a z-direction.

Referring to FIG. 1, the display apparatus 1 may include a display area DA and a peripheral area PA located outside the display area DA. The display apparatus 1 may provide an image through an array of a plurality of pixels PX in the display area DA. The pixel PX may be defined as a light-emitting area where a light-emitting element emits light. In other words, an image may be provided by the light emitted by the light-emitting element through the pixel PX. The light-emitting element may be driven by a pixel circuit. The light-emitting elements and pixel circuits may be arranged in the display area DA. Furthermore, various signal wirings, power wirings, and the like, which are electrically connected to the pixel circuits, may be arranged in the display area DA.

The peripheral area PA, which is an area where no image is provided, may entirely or partially surround the display area DA. Various wirings, driving circuits, and the like to provide electrical signals or power to the display area DA may be arranged in the peripheral area PA.

The display apparatus 1, when viewed in a direction perpendicular to one surface thereof, may have an approximately rectangular shape. For example, the display apparatus 1, as illustrated in FIG. 1, may have generally a rectangular planar shape including, for example, a short side extending in an x-direction and a long side extending in a y-direction. As illustrated in FIG. 1, a corner where the short side in the x-direction meets the long side in the y-direction may have a right-angle shape, or a round shape having a certain curvature. The planar shape of the display apparatus 1 is not limited to a rectangle, and may have various shapes such as polygonal such as triangular and the like, circular, oval, amorphous, and the like.

Although FIG. 1 illustrates the display apparatus 1 having a flat display surface, the disclosure is not limited thereto. In another embodiment, the display apparatus 1 may include a 3D display surface or a curved display surface. When the display apparatus 1 includes a 3D display surface, the display apparatus 1 may include a plurality of display areas indicating different directions, for example, a polygonal column type display surface. In another embodiment, when the display apparatus 1 includes a curved display surface, the display apparatus 1 may be implemented in various forms such as a flexible, foldable, or rollable display apparatus and the like.

In the following description, for convenience of explanation, although the display apparatus 1 is described as being used in smart phones, the display apparatus 1 according to the disclosure is not limited thereto. The display apparatus 1 may be used as a display screen not only for portable electronic apparatuses such as mobile phones, smart phones, tablet personal computers (PCs), mobile communication terminals, electronic organizers, electronic books, portable multimedia players ("PMPs"), navigation devices, ultra-mobile PCs ("UMPCs"), and the like, but also for various products such as televisions, notebooks, monitors, billboards, Internet of things ("IOT"), and the like. Furthermore, the display apparatus 1 according to an embodiment may be used for wearable devices such as smart watches, watch phones, glasses type displays, and head mounted displays ("HMDs"). Furthermore, the display apparatus 1 according to an embodiment may be used as a display for an instrument panel for vehicles, a center information display ("CID") arranged on the center fascia or dashboard of vehicles, a room mirror display in lieu of a side mirror of vehicles, or a display arranged at the rear side of a front seat as an entertainment for a rear seat of vehicles.

Furthermore, in the following description, although the display apparatus 1 is described as a light-emitting element including an organic light-emitting diode ("OLED"), the display apparatus 1 according to the disclosure is not limited thereto. In another embodiment, the display apparatus 1 may be a light-emitting display apparatus including an inorganic light-emitting diode, that is, an inorganic light-emitting display apparatus. In another embodiment, the display apparatus 1 may be a quantum-dot light-emitting display apparatus.

Figure 2A:
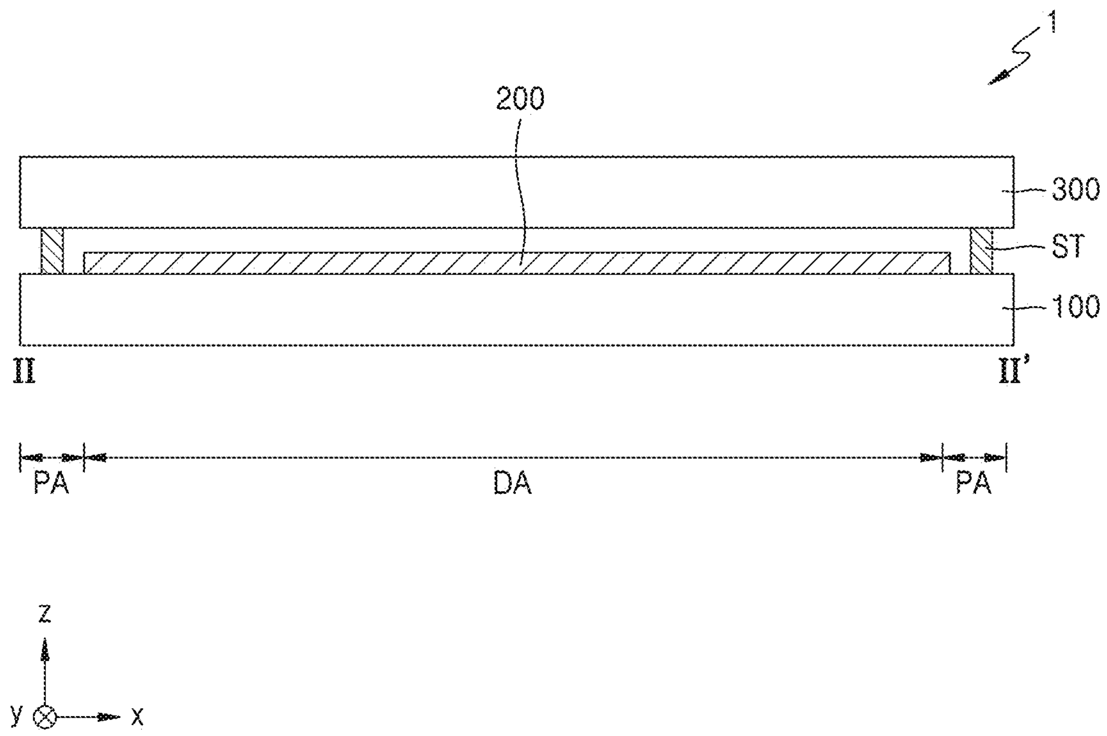
FIGS. 2A and 2B are schematic cross-sectional views of a display apparatus according to embodiments of the disclosure.
Figure 2B:
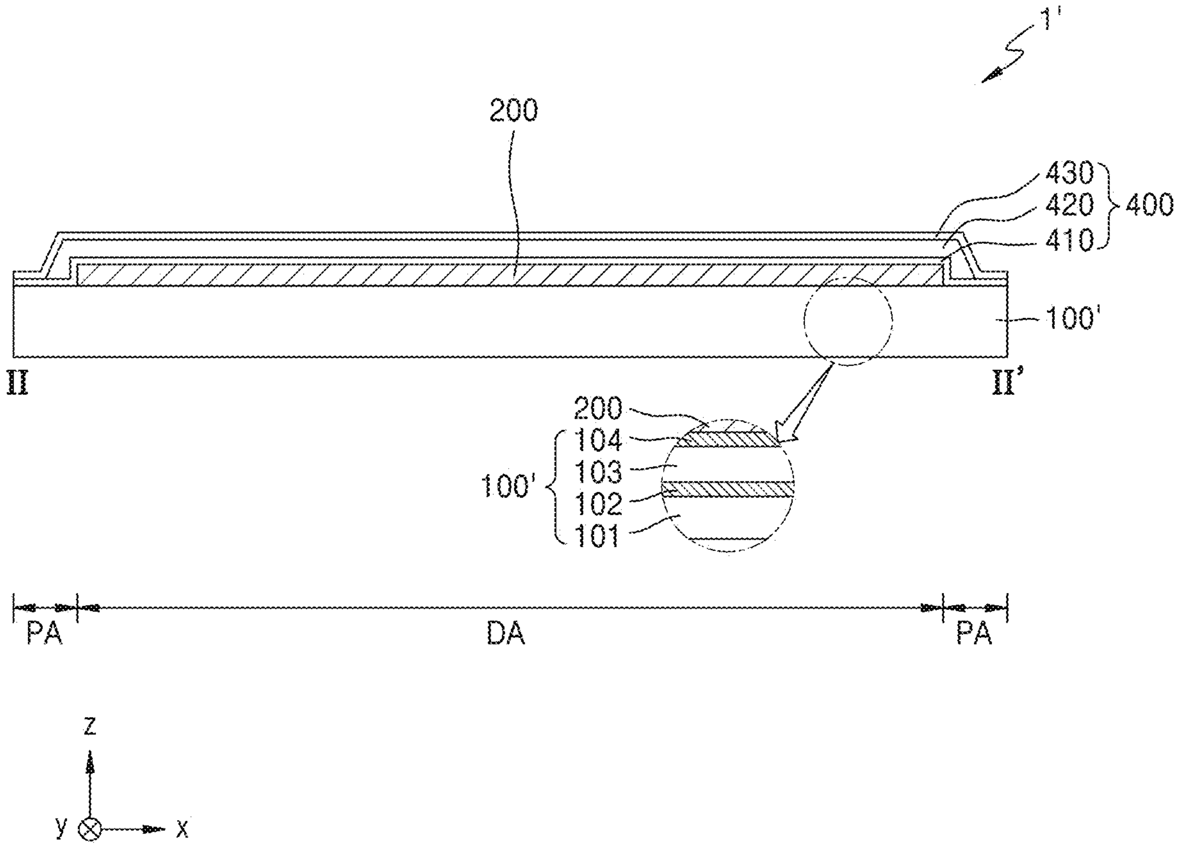

FIGS. 2A and 2B are schematic cross-sectional views of the display apparatus 1 taken along line II-II' of FIG. 1 according to embodiments of the disclosure.

Referring to FIG. 2A, the display apparatus 1 may include a substrate 100 and a display layer 200 disposed on the substrate 100. The substrate 100 may include, as an example, a glass material or polymer resin. For example, the substrate 100 may include a glass material containing $SiO_2$ as a main component, or resin such as reinforced plastic.

The display layer 200 may be located in the display area DA, and may include a pixel circuit and a light-emitting element electrically connected to the pixel circuit. The pixel circuit may include a plurality of thin film transistors and a storage capacitor. The light-emitting element may be driven by the pixel circuit, and may emit light through a pixel. The light-emitting element may include a light-emitting diode, for example, an OLED.

The display layer 200 may be covered by an encapsulation member. For example, the display layer 200 may be covered by an encapsulation substrate 300. The encapsulation substrate 300 may include a glass material or polymer resin. For example, the encapsulation substrate 300 may include a glass material containing $SiO_2$ as a main component, or resin such as reinforced plastic.

The encapsulation substrate 300 may be disposed to face the substrate 100, and a sealant ST may be disposed between the substrate 100 and the encapsulation substrate 300. The sealant ST may be located in the peripheral area PA, and provided between the substrate 100 and the encapsulation substrate 300. The sealant ST may bond the substrate 100 and the encapsulation substrate 300 together. The sealant ST may entirely surround the display layer 200. For example, when viewed from a direction perpendicular to an upper surface of the substrate 100, that is, in a plan view, the display area DA may be entirely surrounded by the sealant ST.

Referring to FIG. 2B, a display apparatus 1' may include a substrate 100', the display layer 200 on the substrate 100', and an encapsulation layer 400 that covers the display layer 200, as an encapsulation member. The encapsulation layer 400 may cover the entirety of the display area DA in a plan view, and cover at least part of the peripheral area PA.

The encapsulation layer 400 may include at least one inorganic encapsulation layer and at least one organic encapsulation layer. In an embodiment, FIG. 2B illustrates the encapsulation layer 400 that includes a first inorganic encapsulation layer 410, a second inorganic encapsulation layer 430, and an organic encapsulation layer 420 therebetween.

The first and second inorganic encapsulation layers 410 and 430 may each include one or more inorganic insulating materials. The first and second inorganic encapsulation layers 410 and 430 may each include one or more inorganic insulating materials such as a silicon oxide ($SiO_2$), a silicon nitride (SiNx), a silicon oxynitride (SiOxNy), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$). In an embodiment, the first and second inorganic encapsulation layers 410 and 430 may be formed by a chemical vapor deposition ("CVD") method and the like.

The organic encapsulation layer 420 may include a polymer-based material. The polymer-based material may include acrylic resin, epoxy-based resin, polyimide, polyethylene, and the like. For example, the organic encapsulation layer 420 may include acrylic resin, for example, polymethylmethacrylate, polyacrylic acid, and the like.

In an embodiment, the substrate 100' may include polymer resin, and may be formed in a multilayer. For example, the substrate 100', as illustrated in FIG. 2B, may have a stack structure of a first base layer 101, a first barrier layer 102, a second base layer 103, and a second barrier layer 104.

The first and second base layers 101 and 103 may each include polymer resin. For example, the first and second base layers 101 and 103 may each include polyimide ("PI"), polyethersulfone ("PES"), polyarylate, polyetherimide ("PEI"), polyethylene naphthalate ("PEN"), polyethylene terephthalate ("PET"), polyphenylene sulfide ("PPS"), polycarbonate ("PC"), cellulose triacetate ("TAC"), cellulose acetate propionate ("CAP"), or/and the like.

The first and second barrier layers 102 and 104, which are barrier layers, respectively, to prevent infiltration of external foreign materials, may include inorganic materials such as $SiO_2$, SiNx, and SiOxNy.

As such, when the display apparatus 1' include the substrate 100' having a multilayer structure including polymer resin and the encapsulation layer 400, flexibility of the display apparatus 1' may be improved.

Figure 3:
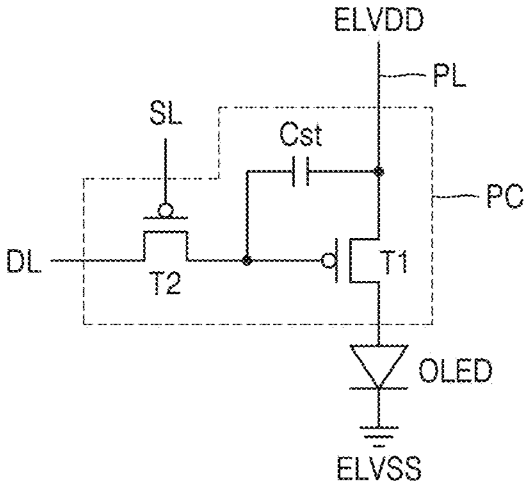
FIG. 3 is an equivalent circuit diagram of any one pixel circuit in a display apparatus according to one or more embodiments.

FIG. 3 is an equivalent circuit diagram of any one pixel circuit in the display apparatus 1 according to one or more embodiments.

Referring to FIG. 3, a pixel circuit PC may include a plurality of thin film transistors and a storage capacitor, and may be electrically connected to an organic light-emitting diode OLED. In an embodiment, the pixel circuit PC may include a driving thin film transistor T1, a switching thin film transistor T2, and a storage capacitor Cst.

The switching thin film transistor T2 may be connected to a scan line SL and a data line DL, and may transmit a data signal or a data voltage input from the data line DL to the driving thin film transistor T1, on the basis of a scan signal or a switching voltage input from the scan line SL. The storage capacitor Cst may be connected to the switching thin film transistor T2 and a driving voltage line PL, and may store a voltage corresponding to a difference between a voltage received from the switching thin film transistor T2 and a driving power voltage ELVDD supplied via the driving voltage line PL.

The driving thin film transistor T1 may be connected to the driving voltage line PL and the storage capacitor Cst, and may control a driving current flowing from the driving voltage line PL to the organic light-emitting diode OLED, corresponding to the voltage value stored in the storage capacitor Cst. A common electrode, for example, a cathode, of the organic light-emitting diode OLED may receive a common power voltage ELVSS. The organic light-emitting diode OLED may emit light having a certain luminance by the driving current.

Although the pixel circuit PC is described to include two thin film transistors and one storage capacitor, the disclosure is not limited thereto. For example, the pixel circuit PC may include three or more thin film transistors and/or two or more storage capacitors. In an embodiment, the pixel circuit PC may include seven thin film transistors and one storage capacitor. The number of thin film transistors and storage capacitors may be changed in various ways according to the design of the pixel circuit PC. In the following description, for convenience of explanation, a case in which the pixel circuit PC includes two thin film transistors and one storage capacitor is described.

Figure 4:
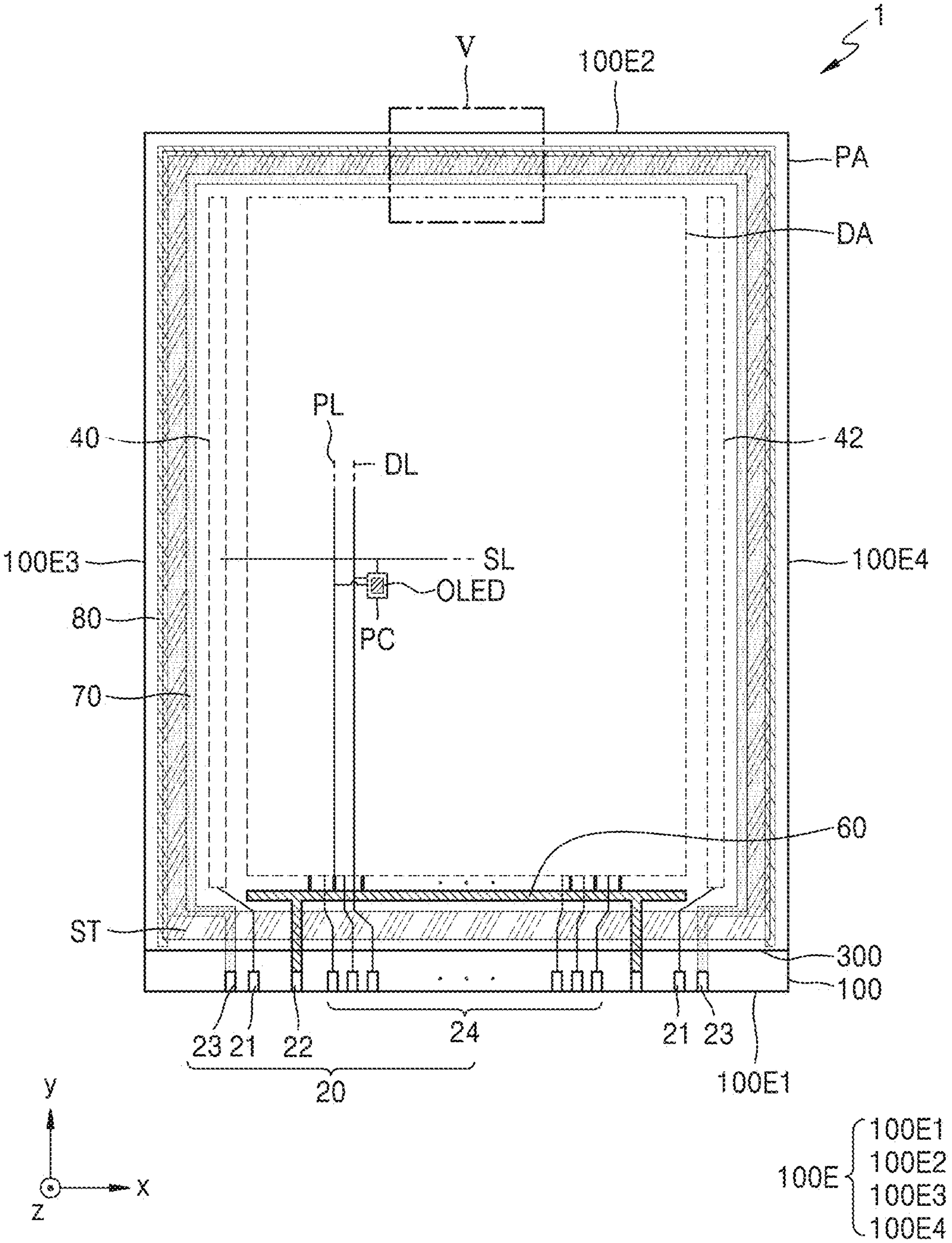
FIG. 4 is a schematic plan view of a display apparatus according to one or more embodiments.

FIG. 4 is a schematic plan view of the display apparatus 1 according to one or more embodiments.

Referring to FIG. 4, the display apparatus 1 may include the substrate 100, and various constituent elements provided in the display apparatus 1 and described below may be disposed on the substrate 100. The substrate 100 may include, in a plan view, a plurality of edges 100E that define the shape of the substrate 100. For example, the substrate 100 may include a first edge 100E1 and a second edge 100E2, extending in the x-direction, and a third edge 100E3 and a fourth edge 100E4, extending in the y-direction. The first edge 100E1 and the second edge 100E2 may be located at the opposite sides, and the third edge 100E3 and the fourth edge 100E4 may be located at the opposite sides.

The display apparatus 1 may include the display area DA and the peripheral area PA located outside the display area DA.

The pixel circuit PC may be arranged in the display area DA. The pixel circuit PC may be electrically connected to the scan line SL extending in the x-direction and the data line DL and the driving voltage line PL extending in in the y-direction crossing the x-direction. The pixel circuit PC may drive the organic light-emitting diode OLED that is provided as a light-emitting element. The organic light-emitting diode OLED may emit, for example, red, green, blue, or white light.

The peripheral area PA may surround the display area DA, in a plan view. For example, the peripheral area PA may entirely or partially surround the display area DA. The peripheral area PA, which is an area where the organic light-emitting diode OLED is not arranged, may be a non-display area where no image is provided. A pad portion 20, the driving units 40 and 42, a driving power supply layer 60, and a common power supply layer 70, and the like may be arranged in the peripheral area PA.

The pad portion 20 may be arranged at one side of the substrate 100, for example, at a side of the first edge 100E1 of the substrate 100. The pad portion 20 may be arranged outside the display area DA and exposed without being covered by an insulating layer, and may be electrically connected to a printed circuit board (not shown), for example, a flexible printed circuit board on which a data driving circuit and the like is mounted. The pad portion 20 may include first to fourth terminals 21, 22, 23, and 24, to which a printed circuit board, various electronic elements, and the like are electrically attached.

The driving units 40 and 42 may be arranged, for example, at both sides of the display area DA. As illustrated in FIG. 4, the driving units 40 and 42 may be provided between the third edge 100E3 of the substrate 100 and the display area DA and between the fourth edge 100E4 of the substrate 100 and the display area DA, respectively. The driving units 40 and 42 may each include, for example, a scan driving circuit. The scan driving circuit may generate and transmit a scan signal to each pixel circuit PC via the scan line SL. The driving units 40 and 42 may be connected to a first terminal 21 of the pad portion 20, and may receive an electrical signal from an external control unit through the first terminal 21. Although the driving units 40 and 42 are described as being arranged at both sides of the display area DA, the disclosure is not limited thereto. In another embodiment, only one of the driving units 40 and 42 may be provided and arranged at one side of the display area DA. In some embodiments, the driving units 40 and 42 may further include a light-emitting control circuit.

The driving power supply layer 60 may be arranged at one side of the display area DA, for example, between the pad portion 20 and the display area DA. The driving power supply layer 60 may be connected to a second terminal 22 of the pad portion 20, and may receive an application of the driving power voltage ELVDD from an external power unit through the second terminal 22. The driving power supply layer 60 may provide the driving power voltage ELVDD to each pixel circuit PC via the driving voltage line PL.

The common power supply layer 70 may partially surround the display area DA. For example, the common power supply layer 70, which is in a loop form in which a side of the first edge 100E1 of the substrate 100 is open, may extend along the second to fourth edges 100E2, 100E3, and 100E4 of the substrate 100. The common power supply layer 70 may be connected to a third terminal 23 of the pad portion 20, and may receive an application of the common power voltage ELVSS from the external power unit through the third terminal 23. The common power supply layer 70 may provide the common power voltage ELVSS to a counter electrode of each organic light-emitting diode OLED.

The data line DL described above may be electrically to a fourth terminal 24 of the pad portion 20, and may receive a data signal from the printed circuit board through the fourth terminal 24.

In an embodiment, the encapsulation substrate 300 may be disposed on the substrate 100, and the sealant ST may be provided between the substrate 100 and the encapsulation substrate 300. For example, the encapsulation substrate 300 may have an area smaller than the substrate 100 in a plan view, and the pad portion 20 arranged at a side of the first edge 100E1 of the substrate 100 may be exposed without being covered by the encapsulation substrate 300.

The sealant ST may include, for example, an inorganic material such as frit. In another embodiment, the sealant ST may include epoxy and the like. The sealant ST may be located in the peripheral area PA, and as illustrated in FIG. 4, may entirely surround the display area DA, in a plan view. Accordingly, a space formed by the substrate 100, the encapsulation substrate 300, and the sealant ST may be blocked by the outside so that external moisture or impurities may be prevented from infiltrating into the display apparatus 1.

According to an embodiment, the display apparatus 1 may include a plurality of metal patterns 80 located in the peripheral area PA. The metal patterns 80 may be located and arranged on the substrate 100 along the edges 100E. The metal patterns 80 may surround at least part of the display area DA, in a plan view. In an example, as illustrated in FIG. 4, the metal patterns 80 may be arranged along the second edge 100E2, the third edge 100E3, and the fourth edge 100E4 of the substrate 100, and may surround three sides of the display area DA. In another embodiment, the metal patterns 80 may be arranged along all of the first to fourth edges 100E1, 100E2, 100E3, and 100E4 of the substrate 100, and may entirely surround the display area DA.

The metal patterns 80, which are arranged at the outermost side of the substrate 100, may prevent external static electricity from flowing into the display apparatus 1 during use thereof. Furthermore, the metal patterns 80 may serve to discharge or distribute static electricity generated during manufacturing or use of the display apparatus 1. Accordingly, a damage to the organic light-emitting diode OLED, the pixel circuit PC, and/or the like due to the intrusion of static electricity into the display area DA, which causes a defect of the display apparatus 1, may be prevented.

Figure 5:
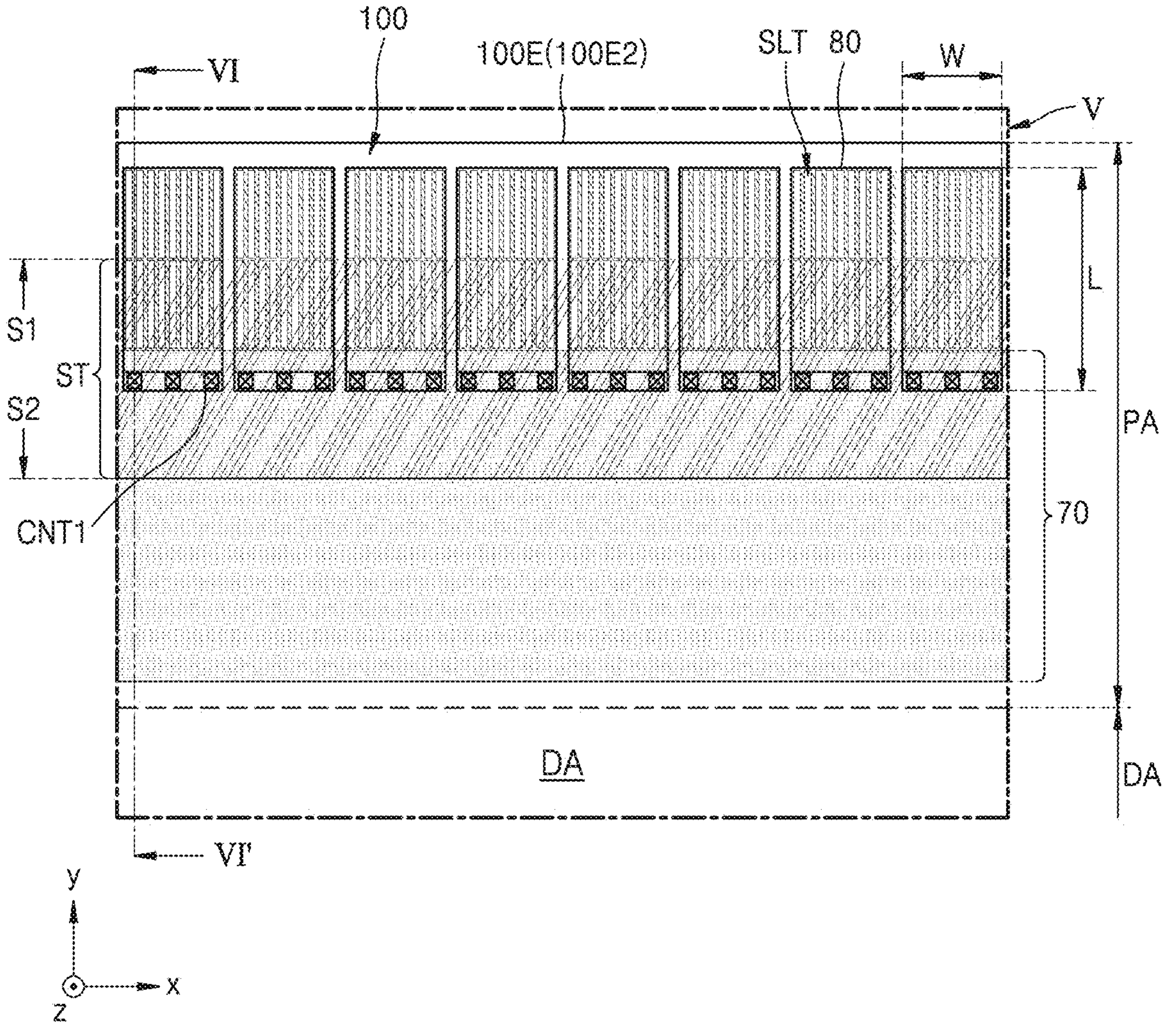
FIG. 5 is a schematic enlarged plan view showing a portion of a display apparatus according to one or more embodiments.

FIG. 5 is a schematic enlarged plan view showing a portion of the display apparatus 1 according to one or more embodiments. FIG. 5 may correspond to a portion V of the display apparatus 1 of FIG. 4.

Referring to FIG. 5, the metal patterns 80 may be located in the peripheral area PA to be apart from each other, in a plan view. For example, the metal patterns 80 may be arranged apart from each other in a direction along the edges 100E of the substrate 100. In other words, the metal patterns 80 may each have an island shape or an isolated shape.

In an embodiment, each of the metal patterns 80 may include a plurality of slits SLT. Each of the slits SLT may be formed by penetrating a corresponding one of the metal patterns 80 in a thickness direction thereof, for example, a z-direction. Each of the slits SLT may extend in a direction from the display area DA to the outside (i.e., z-direction).

As described above, as the metal patterns 80 are arranged apart from each other and each of the metal patterns 80 includes the plurality of slits SLT, the total area of the metal patterns 80, as seen in a plan view, may be reduced. As the total area of the metal patterns 80 decreases, the total capacitance of the metal patterns 80 may be reduced. As electric charges of static electricity may be accumulated in the metal patterns 80 due to various physical contacts and the like, during manufacturing of the display apparatus 1, the maximum amount of electric charges accumulated in the metal patterns 80 may be reduced by reducing the total capacitance of the metal patterns 80. Accordingly, the accumulated electric charges flow into the display area DA, and thus, an adverse effect of damaging the insulating layer may be reduced.

Each of the metal patterns 80 may extend in a direction from the display area DA to each of the edges 100E of the substrate 100. In detail, each of the metal patterns 80 may have a width W along the edges 100E of the substrate 100 (i.e., x-direction) and a length L in a direction crossing the edges 100E (i.e., y-direction). For example, the width W may be 0.1 millimeters (mm) to 1.0 mm. In each of the metal patterns 80, the length L may be greater than the width W. The metal patterns 80 as above may serve as a lightning rod. In other words, external static electricity may be preferentially induced by the metal patterns 80 and prevented from flowing into the display area DA through other paths.

In an embodiment, the common power supply layer 70 may be electrically connected to the metal patterns 80 via a first contact hole CNT1. To this end, the common power supply layer 70 may overlap at least part of the metal patterns 80 in a plan view. The first contact hole CNT1 may be located in an area where the common power supply layer 70 and the metal patterns 80 overlap each other. In an embodiment, to reduce an overlap region between the common power supply layer 70 and the metal patterns 80 in a plan view, the first contact hole CNT1 may be located at an end portion of each of the common power supply layer 70 and the metal patterns 80.

The metal patterns 80 may receive an application of the common power voltage ELVSS from the common power supply layer 70. In other words, the metal patterns 80 may receive an application of a constant voltage. Accordingly, static electricity generated during the manufacturing or use of the display apparatus 1 may be stably and effectively discharged or distributed. For example, the electric charges accumulated during the manufacturing of the display apparatus 1 may be effectively discharged or distributed to the metal patterns 80, and the external static electricity induced by the metal patterns 80 during the manufacturing or use of the display apparatus 1 may be effectively discharged or distributed.

Figure 6:
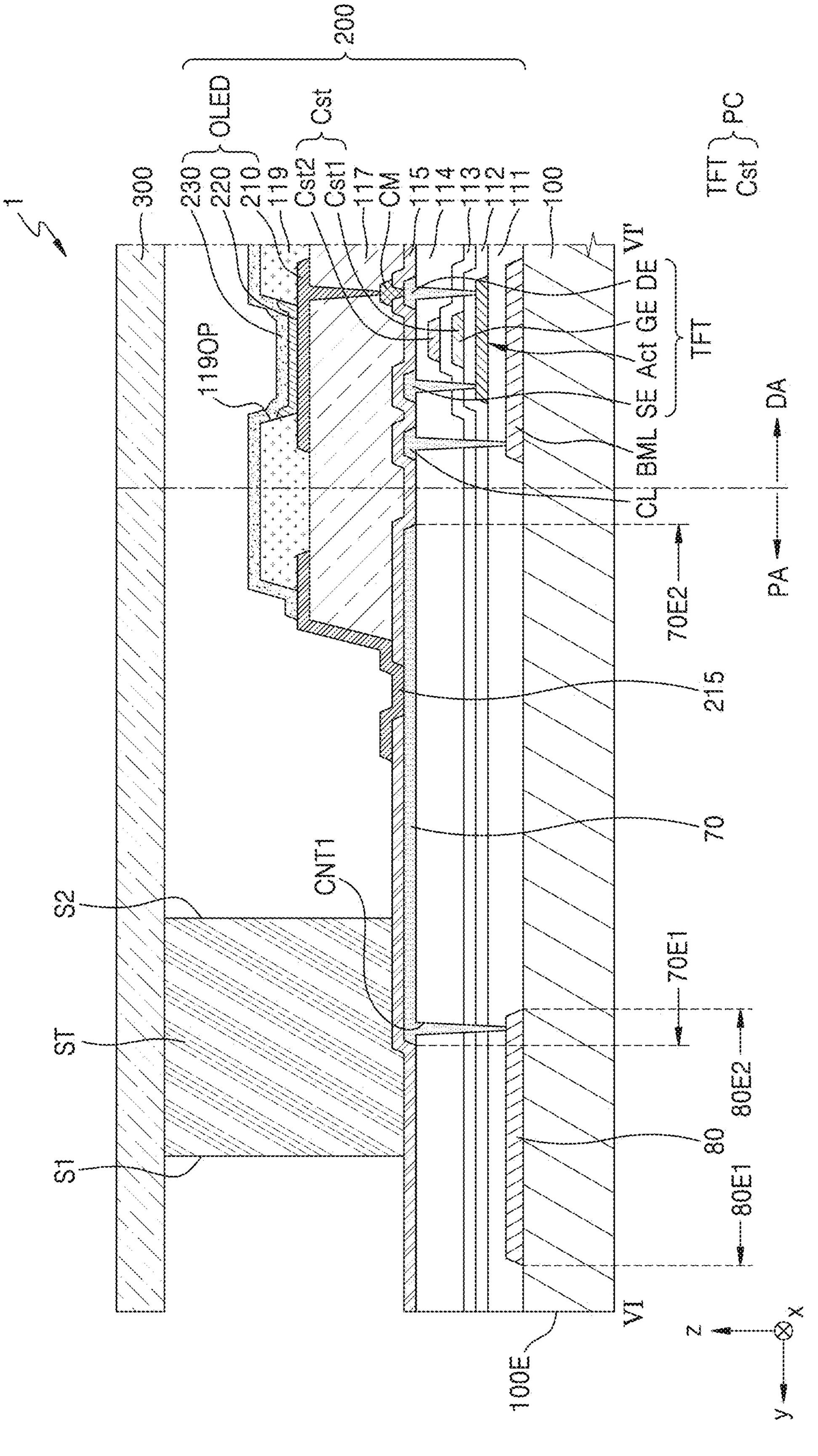
FIG. 6 is a schematic cross-sectional view showing a portion of a display apparatus according to one or more embodiments.

FIG. 6 is a schematic cross-sectional view of the display apparatus 1 according to one or more embodiments, which corresponds to a cross-sectional view of the display apparatus 1 taken along line VI-VI' of FIG. 5.

Referring to FIG. 6, the display apparatus 1 (See FIG. 2A) may include the display area DA and the peripheral area PA located outside the display area DA. The pixel circuit PC and the organic light-emitting diode OLED that is electrically connected to the pixel circuit PC may be located in the display area DA. The sealant ST, the common power supply layer 70, a connection conductive layer 215, the metal patterns 80, and the like may be located in the peripheral area PA. The constituent elements of the display apparatus 1 may be arranged on the substrate 100.

The substrate 100 may include various materials, for example, a glass material, quartz, a metal material, or polymer resin such as PET, PEN, polyimide, and the like, and have a single layer or multilayer structure. For convenience of explanation, although the substrate 100 of FIG. 6 is described as having a single layer structure including a glass material, the disclosure is not limited thereto.

A buffer layer 111 may be disposed on the substrate 100. The buffer layer 111 may reduce or block infiltration of foreign materials, moisture, or external air from the outside of the substrate 100, and provide a planarized surface to the substrate 100. The buffer layer 111 may include an inorganic material such as a silicon oxide (SiOx), SiNx, a silicon oxynitride (SiON), an organic material, or an organic/inorganic complex, and may have a single layer or multilayer structure of an inorganic material and an organic material.

The pixel circuit PC may be disposed on buffer layer 111. The pixel circuit PC may include a plurality of thin film transistors TFT and a storage capacitor Cst. For convenience of illustration, FIG. 6 illustrates one thin film transistor TFT and one storage capacitor Cst, and a stack structure of the pixel circuit PC is described accordingly.

The thin film transistor TFT may include a semiconductor layer Act, a gate electrode GE that overlaps the semiconductor layer Act, a source electrode SE, and a drain electrode DE in a plan view. The semiconductor layer Act may include polycrystalline silicon, amorphous silicon, or an oxide semiconductor material. The semiconductor layer Act may include a channel region, and a source region and a drain region that are arranged at both sides of the channel region. The source region and the drain region, which are areas having resistance that is less than the resistance of the channel region, may be formed through an impurity doping process or a conductivity process.

The gate electrode GE may include a low-resistance metal material. The gate electrode GE may include a conductive material including molybdenum (Mo), aluminum (Al), copper (Cu), titanium (Ti), and the like, and may have a multilayer or single layer structure including the above-described material. For example, the gate electrode GE may include a Mo layer and an Al layer, or have a multilayer structure of Mo/Al/Mo.

The source electrode SE and the drain electrode DE may also include a conductive material including Mo, Al, Cu, Ti, and the like, and may have a multilayer or single layer structure including the above-described material. For example, the source electrode SE and the drain electrode DE may include a Ti layer and an Al layer, or may have a multilayer structure of Ti/Al/Ti. The source electrode SE and the drain electrode DE may each be connected to the source region and the drain region of the semiconductor layer Act. In some embodiments, the source region and the drain region may correspond to the source electrode SE and the drain electrode DE of the thin film transistor TFT, respectively.

The storage capacitor Cst may include a first capacitor plate Cst1 and a second capacitor plate Cst2 overlapping each other in a plan view.

In some embodiments, as illustrated in FIG. 6, the storage capacitor Cst may be disposed to overlap the thin film transistor TFT, and in this case, the first capacitor plate Cst1 may be the gate electrode GE of the thin film transistor TFT. However, the disclosure is not limited thereto, and in another embodiment, the storage capacitor Cst may not overlap the thin film transistor TFT in a plan view. In this case, the first capacitor plate Cst1 may be an independent constituent element that is separate from the gate electrode GE of the thin film transistor TFT.

The second capacitor plate Cst2 may include Al, platinum (Pt), palladium (Pd), silver (Ag), magnesium (Mg), gold (Au), nickel (Ni), neodymium (Nd), iridium (Ir), chromium (Cr), lithium (Li), calcium (Ca), Mo, Ti, tungsten (W), and/or Cu, and may be a single layer or multilayer of the above-described material. In an embodiment, the second capacitor plate Cst2 may be a metal layer including Mo.

To secure insulation between the semiconductor layer Act and the gate electrode GE, a first gate insulating layer 112 may be provided between the semiconductor layer Act and the gate electrode GE. The first gate insulating layer 112 may include an inorganic insulating material such as SiOx, SiNx, SiON, $Al_2O_3$, $TiO_2$, $Ta_2O_5$, a hafnium oxide ($HfO_2$), $ZnO_2$, or the like. The first gate insulating layer 112 may be a single layer or multilayer including the above-described inorganic insulating material.

A second gate insulating layer 113 may be provided between the gate electrode GE and the second capacitor plate Cst2 of the storage capacitor Cst. The second gate insulating layer 113 may include an inorganic insulating material such as $SiO_2$, SiNx, SiON, $Al_2O_3$, $TiO_2$, $Ta_2O_5$, $HfO_2$, $ZnO_2$, or the like, and may include a single layer or multilayer of the above-described material.

An interlayer insulating layer 114 may be disposed on the second capacitor plate Cst2 of the storage capacitor Cst. The interlayer insulating layer 114 may include an inorganic insulating material such as $SiO_2$, SiNx, SiON, $Al_2O_3$, $TiO_2$, $Ta_2O_5$, $HfO_2$, $ZnO_2$, or the like, and may include a single layer or multilayer of the above-described material.

The source electrode SE and the drain electrode DE may be disposed on the interlayer insulating layer 114. Furthermore, a conductive line CL may be disposed on the interlayer insulating layer 114. The conductive line CL may correspond to, for example, the driving voltage line PL of FIG. 3. The conductive line CL may be formed in the same process as the source electrode SE and the drain electrode DE, and may include the same material.

A passivation layer 115 may be disposed on the source electrode SE, the drain electrode DE, and the conductive line CL. The passivation layer 115 may cover the source electrode SE, the drain electrode DE, and the conductive line CL. The passivation layer 115 may include an inorganic insulating material such as SiOx, SiNx, SiON, $Al_2O_3$, $TiO_2$, $Ta_2O_5$, $HfO_2$, $ZnO_2$, or the like, and may be a single layer or multilayer including the above-described inorganic insulating material.

A planarization layer 117 may be disposed on the passivation layer 115. The planarization layer 117 may have a flat upper surface such that a pixel electrode 210 disposed on the flat upper surface may be formed flat. To this end, after the planarization layer 117 is formed, chemical mechanical polishing may be performed to provide a flat upper surface.

The planarization layer 117 may have a single layer or multilayer structure including an organic material or an inorganic material. For example, the planarization layer 117 may include an organic insulating material. As such, the planarization layer 117 may include an organic insulating material such as benzocyclobutene ("BCB"), polyimide, hexamethyldisiloxane ("HMDSO"), polymethylmethacrylate ("PMMA"), polystyrene ("PS"), or acryl.

The organic light-emitting diode OLED may be disposed on the planarization layer 117. The organic light-emitting diode OLED may have a stack structure including for example, the pixel electrode 210, a counter electrode 230 on the pixel electrode 210, and an intermediate layer 220 between the pixel electrode 210 and the counter electrode 230.

The pixel electrode 210 may be disposed on the planarization layer 117. The pixel electrode 210 may be electrically connected to the thin film transistor TFT through a contact metal CM on the passivation layer 115. For example, the pixel electrode 210 may contact the contact metal CM via a contact hole that penetrates the planarization layer 117, and the contact metal CM may contact the source electrode SE or the drain electrode DE of the thin film transistor TFT via a contact hole that penetrates the passivation layer 115. The contact metal CM may include a low-resistance metal material.

The pixel electrode 210 may include a conductive oxide such as an indium tin oxide ("ITO"), an indium zinc oxide ("IZO"), a zinc oxide (ZnO), an indium oxide (In203), an indium gallium oxide ("IGO") or an aluminum zinc oxide ("AZO"). In another embodiment, the pixel electrode 210 may include a reflective film such as Ag, Mg, Al, Pt, Pd, Au, Ni, Nd, Ir, Cr, or a compound thereof. In another embodiment, the pixel electrode 210 may further include a film including ITO, IZO, ZnO, or In203 above/below the above-described reflective film. In some embodiments, the pixel electrode 210 may have a stack structure of ITO/Ag/ITO.

A pixel defining layer 119 may be disposed on the planarization layer 117. An opening 119OP overlapping part of the pixel electrode 210 in a plan view may be defined in the pixel defining layer 119. The opening 119OP of the pixel defining layer 119 may expose a center portion of the pixel electrode 210 and define a light-emitting area of light emitted from the organic light-emitting diode OLED. For example, the size/width of the opening 119OP may correspond to the size/width of the light-emitting area. Accordingly, the size and/or width of the pixel PX may depend on the size and/or width of the opening 119OP of the pixel defining layer 119 that corresponds to the pixel PX.

The pixel defining layer 119 may cover an edge of the pixel electrode 210. The pixel defining layer 119 may serve to prevent the occurrence of arc and the like at the edge of the pixel electrode 210, by increase a distance between the edge of the pixel electrode 210 and the counter electrode 230 above the pixel electrode 210.

The pixel defining layer 119 may be formed of an organic insulating material such as polyimide, polyamide, acryl resin, BCB, HMDSO, phenol resin, and the like, by a method such as spin coating and the like.

The intermediate layer 220 may be arranged to overlap the pixel electrode 210 in a plan view, and may include a light-emitting layer. The light-emitting layer of the intermediate layer 220 may include a polymer or a low molecular weight organic material that emits light of a certain color. Alternatively, the light-emitting layer may include an inorganic light-emitting material or quantum dots. The light-emitting layer may emit red, green, or blue light. The light-emitting layer may be integrally formed over the pixel electrodes 210, or may be pattered to correspond to each pixel electrode 210.

In some embodiments, the intermediate layer 220 may include a first functional layer and a second functional layer that are disposed below and above the light-emitting layer, respectively. The first functional layer may include, for example, a hole transport layer, or a hole transport layer and a hole injection layer. The second functional layer, as a constituent element disposed above the light-emitting layer, may include an electron transport layer and/or an electron injection layer. The first functional layer and/or the second functional layer may be a common layer that covers the entirety of the display area DA, like the counter electrode 230 that is described below.

The counter electrode 230 may be disposed on and above the pixel defining layer 119 and the pixel electrode 210 to overlap the pixel electrode 210 in a plan view. In an embodiment, the counter electrode 230 may be integrally formed to overlap the pixel electrodes 210. The counter electrode 230 may cover the entirety of the display area DA. The counter electrode 230 may be a light-transmissive electrode or a reflective electrode. In some embodiments, the counter electrode 230 may be a transparent or semi-transparent electrode, and may include a metal thin film having a relatively small work function including Li, Ca, lithium fluoride/calcium (LiF/Ca), lithium fluoride/aluminum (LiF/Al), Al, Ag, Mg, and a compound thereof. Furthermore, the counter electrode 230 may further include a transparent conductive oxide ("TCO") film such as ITO, IZO, ZnO, $In_2O_3$, or the like, other than the metal thin film.

In some embodiments, a capping layer (not shown) may be formed on the counter electrode 230. The capping layer may include an inorganic insulating material such as LiF, $SiO_2$, SiNx, and SiOxNy, and/or an organic insulating material.

According to an embodiment, the display apparatus 1 may include a bottom metal layer BML provided between the substrate 100 and the thin film transistor TFT. As an example, the bottom metal layer BML may be directly disposed on an upper surface of the substrate 100, and covered by the buffer layer 111. The bottom metal layer BML may include one or more metal materials of Al, Pt, Pd, Ag, Mg, Au, Ni, Nd, Ir, Cr, Li, Ca, Mo, and Cu.

In some embodiments, the bottom metal layer BML may include a light shield material. The bottom metal layer BML may be arranged to overlap the thin film transistor TFT in a plan view. In some embodiments, the bottom metal layer BML may be connected to the conductive line CL, and may receive an application of a constant voltage via the conductive line CL. The bottom metal layer BML may improve and/or stabilize the characteristics of the thin film transistor TFT.

The stack structure on the substrate 100 described above, for example, the stack structure from the bottom metal layer BML to the counter electrode 230 may form the display layer 200.

In an embodiment, the display apparatus 1 may include the encapsulation substrate 300 arranged to face the substrate 100. The encapsulation substrate 300 may be disposed above the substrate 100 such that the display layer 200 is interposed therebetween. The encapsulation substrate 300 may include a transparent material. For example, the encapsulation substrate 300 may include a glass material or a plastic material such as PET, PEN, polyimide, and the like, but the disclosure is not limited thereto.

The sealant ST may be interposed between the substrate 100 and the encapsulation substrate 300, and located in the peripheral area PA. The sealant ST may be attached to, for example, the encapsulation substrate 300, and to the passivation layer 115 on the substrate 100. The sealant ST may include an inner surface S2 facing the display area DA and an outer surface S1 that is an opposite surface to the inner surface S2. As described above, the sealant ST may prevent external moisture, foreign materials, and external air from infiltrating into the display area DA of the display apparatus 1.

According to an embodiment, the metal patterns 80 may be arranged in the peripheral area PA on the substrate 100. The metal patterns 80 may be arranged apart from the display area DA. The metal patterns 80 may block the external static electricity from flowing into the display area DA.

Each of the metal patterns 80 may be arranged to reach farther from the display area DA than the outer surface S1 of the sealant ST, in a plan view. For example, each of the metal patterns 80 may include an inner edge 80E2 facing the display area DA and an outer edge 80E1 that is opposite to the inner edge 80E2, and the outer edge 80E1 of each of the metal patterns 80 may be located closer to the edges 100E of the substrate 100 than the outer surface S1 of the sealant ST. Accordingly, the external static electricity may be preferentially induced to the metal patterns 80 that are close to the edges 100E of the substrate 100, and may be prevented from flowing into the display area DA via other paths.

In an embodiment, the metal patterns 80 may be formed in the same process as the bottom metal layer BML, may include the same material, and may be patterned to be apart from the bottom metal layer BML. The metal patterns 80 may be interposed between the substrate 100 and the buffer layer 111, and the buffer layer 111 may be disposed on the metal patterns 80. Furthermore, the insulating layers on the buffer layer 111, for example, the first gate insulating layer 112, the second gate insulating layer 113, and the interlayer insulating layer 114, may be disposed on the metal patterns 80. The metal patterns 80 may be covered by the buffer layer 111 and the insulating layers 112, 113, and 114. As such, as the metal patterns 80 is covered thick by the buffer layer 111 and the insulating layers 112, 113, and 114, even when the metal patterns 80 reaches farther from the display area DA than the sealant ST as described above, the metal patterns 80 may be protected from external foreign materials, external air, and external moisture.

The common power supply layer 70 may be located in the peripheral area PA, and disposed above the metal patterns 80 such that at least one insulating layer is interposed between the common power supply layer 70 and the metal patterns 80. For example, the common power supply layer 70 may be disposed on the interlayer insulating layer 114, and the buffer layer 111, the first gate insulating layer 112, the second gate insulating layer 113, and the interlayer insulating layer 114 may be interposed between the common power supply layer 70 and the metal patterns 80. In an embodiment, the common power supply layer 70 may be formed in the same process as the conductive line CL, the source electrode SE, and the drain electrode DE, and may include the same material.

The common power supply layer 70 may partially overlap the metal patterns 80, in a plan view. The first contact hole CNT1 may be located in an area where the common power supply layer 70 and each of the metal patterns 80 overlap each other in a plan view. The common power supply layer 70 may be electrically connected to the metal patterns 80 via the first contact hole CNT1. The first contact hole CNT1 may be defined in the insulating layer between the common power supply layer 70 and the metal patterns 80. For example, the first contact hole CNT1 may be formed to penetrate the buffer layer 111, the first gate insulating layer 112, the second gate insulating layer 113, and the interlayer insulating layer 114.

During the manufacturing of the display apparatus 1, electric charges may be accumulated in the metal patterns 80 by the processes performed after the metal patterns 80 are formed. When the accumulated electric charges flow into the display area DA, the pixel circuit PC and/or the organic light-emitting diode OLED may be damaged. However, as the common power supply layer 70 is electrically connected to the metal patterns 80, a constant voltage, for example, the common power voltage ELVSS, may be applied to the metal patterns 80. Accordingly, the electric charges accumulated in the metal patterns 80 may be effectively distributed or discharged. In addition, during the use of the display apparatus 1, the external static electricity that flows in through the metal patterns 80 may be effectively distributed or discharged.

In an embodiment, the first contact hole CNT1 may be located on an inner side (i.e., closer to the display area DA) than the outer surface S1 of the sealant ST, in a plan view. Furthermore, an edge of the common power supply layer 70 may be located on an inner side than the outer surface S1 of the sealant ST, in a plan view. For example, the common power supply layer 70 may include an inner edge 70E2 facing the display area DA and an outer edge 70E1 that is opposite to the inner edge 70E2. Both of the outer edge 70E1 and the inner edge 70E2 of the common power supply layer 70 may be located on an inner side than the outer surface S1 of the sealant ST. That is, both the outer edge 70E1 and the inner edge 70E2 may be located closer to the display area DA than the outer surface S1. In some embodiments, FIG. 6 illustrates that the outer edge 70E1 of the common power supply layer 70 is located on an inner side than the outer surface S1 of the sealant ST, and arranged to overlap the sealant ST in a plan view. As such, as no portion of the first contact hole CNT1 and the common power supply layer 70 is arranged on an outer side (located farther from the display area DA) than the sealant ST, in a plan view, the common power supply layer 70 and the first contact hole CNT1 may be protected by the sealant ST, and accordingly, infiltration of external foreign materials, external moisture, external air, and the like into the display area DA through the common power supply layer 70 and the first contact hole CNT1 may be effectively reduced.

The common power supply layer 70 may be electrically connected to the counter electrode 230 of the organic light-emitting diode OLED. For example, the common power supply layer 70 may be electrically connected to the counter electrode 230 through the connection conductive layer 215. The connection conductive layer 215, for example, may be formed in the same process as the pixel electrode 210, and may include the same material. The counter electrode 230 may extend from the display area DA to the peripheral area PA, and may contact an upper surface of the connection conductive layer 215. Furthermore, the connection conductive layer 215 may contact the common power supply layer 70 via a contact hole defined in the passivation layer 115 thereunder. Accordingly, the counter electrode 230 may receive the common power voltage ELVSS from the common power supply layer 70.

Figure 7:
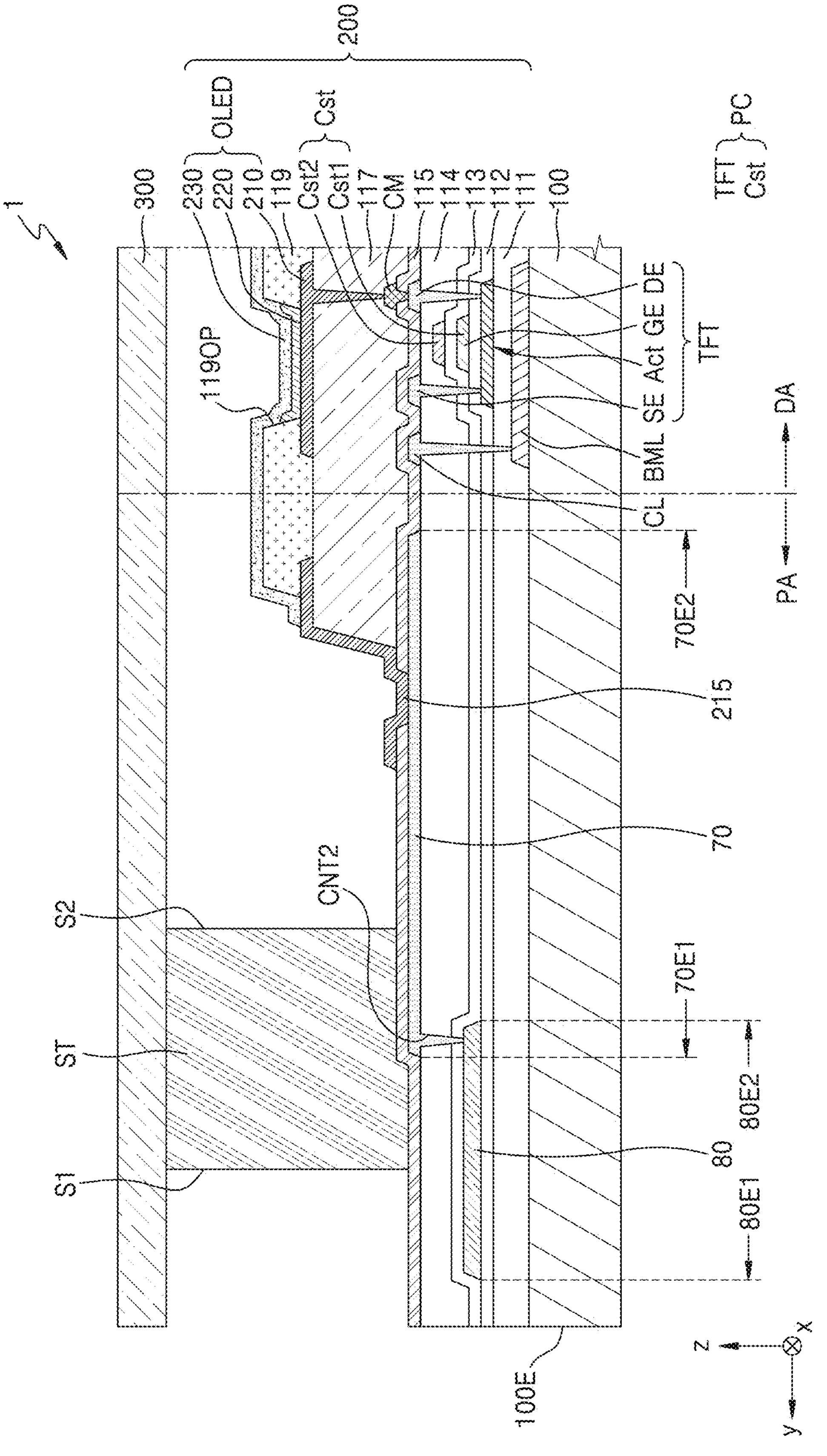
FIG. 7 is a schematic cross-sectional view showing a portion of a display apparatus according to one or more embodiments.

FIG. 7 is a schematic cross-sectional view showing a portion of the display apparatus 1 according to one or more embodiments. FIG. 7 shows a modified embodiment of FIG. 6, and thus, redundant descriptions in the drawings are omitted and only differences therebetween are presented below.

Referring to FIG. 7, the metal patterns 80 may be formed in the same process as the gate electrode GE of the thin film transistor TFT, may include the same material, and may be patterned to be apart from the gate electrode GE. For example, the metal patterns 80 may be disposed between the first gate insulating layer 112 and the second gate insulating layer 113. In this case, the second gate insulating layer 113, the interlayer insulating layer 114, and the passivation layer 115 may be disposed on and above the metal patterns 80. A second contact hole CNT2 that electrically connects the metal patterns 80 and the common power supply layer 70 to each other may be defined in the second gate insulating layer 113 and the interlayer insulating layer 114. As such, as the metal patterns 80 is covered by the buffer layer 111 and the first gate insulating layer 112 thereunder and by the second gate insulating layer 113 and the interlayer insulating layer 114 thereabove, even when the metal patterns 80 are located on an outer side (i.e., reach farther from the display area DA) than the sealant ST as described above, the metal patterns 80 may be protected from the external foreign materials, external air, and external moisture.

Figure 8:
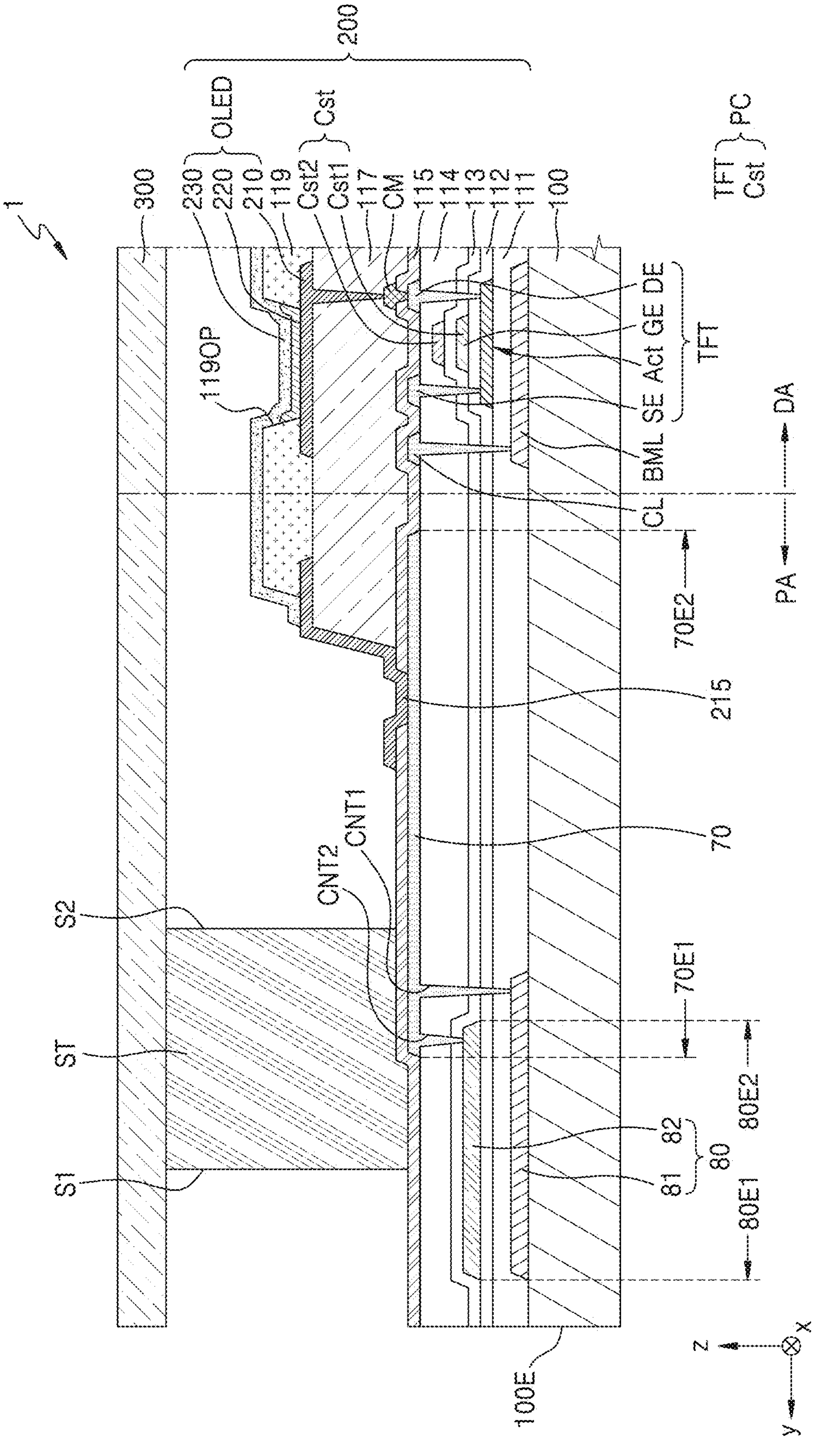
FIG. 8 is a schematic cross-sectional view showing a portion of a display apparatus according to one or more embodiments.

FIG. 8 is a schematic cross-sectional view showing a portion of the display apparatus 1 according to one or more embodiments. FIG. 8 shows a modified embodiment of FIG. 6, and thus, redundant descriptions in the drawings are omitted and only differences therebetween are presented below.

Referring to FIG. 8, the metal patterns 80 may include a plurality of first metal patterns 81 and a plurality of second metal patterns 82, which are disposed on different layers. The first metal patterns 81 and the second metal patterns 82 may all be located in the peripheral area PA, and may be arranged apart from the display area DA. The first metal patterns 81 and the second metal patterns 82 may at least partially overlap each other, in a plan view.

In an embodiment, the first metal patterns 81 may be formed in the same process as the bottom metal layer BML, may include the same material, and may be patterned apart from the bottom metal layer BML. For example, the first metal patterns 81 may be interposed between the substrate 100 and the buffer layer 111.

The second metal patterns 82 may be disposed above the first metal patterns 81. For example, the second metal patterns 82 may be formed in the same process as the gate electrode GE of the thin film transistor TFT, may include the same material, and may be patterned to be spaced apart from the gate electrode GE. For example, the second metal patterns 82 may be disposed on the first gate insulating layer 112, and below the second gate insulating layer 113 and the interlayer insulating layer 114.

As such, as each of the metal patterns 80 includes the first metal pattern 81 and the second metal pattern 82, which are disposed on different layers, a larger number of the metal patterns 80 may be disposed in the same area, and accordingly, a static electricity prevention function by the metal patterns 80 may be improved.

The common power supply layer 70 may be electrically connected to each of the first metal patterns 81 and the second metal patterns 82. For example, the common power supply layer 70 may be electrically connected to the first metal patterns 81 via the first contact hole CNT1, and to the second metal patterns 82 via the second contact hole CNT2. The first contact hole CNT1 may be defined in the insulating layers, for example, the buffer layer 111, the first gate insulating layer 112, the second gate insulating layer 113 and the interlayer insulating layer 114, which are interposed between the common power supply layer 70 and the first metal patterns 81. The second contact hole CNT2 may be defined in the insulating layers, for example, the second gate insulating layer 113 and the interlayer insulating layer 114, which are interposed between the common power supply layer 70 and the second metal patterns 82.

Both of the first contact hole CNT1 and the second contact hole CNT2 may be located on an inner side (i.e., closer to the display area DA) than the outer surface S1 of the sealant ST, in a plan view. Accordingly, the infiltration of external moisture, foreign materials, and external air into the display area DA through the first contact hole CNT1 and/or the second contact hole CNT2 may be reduced.

Figure 9:
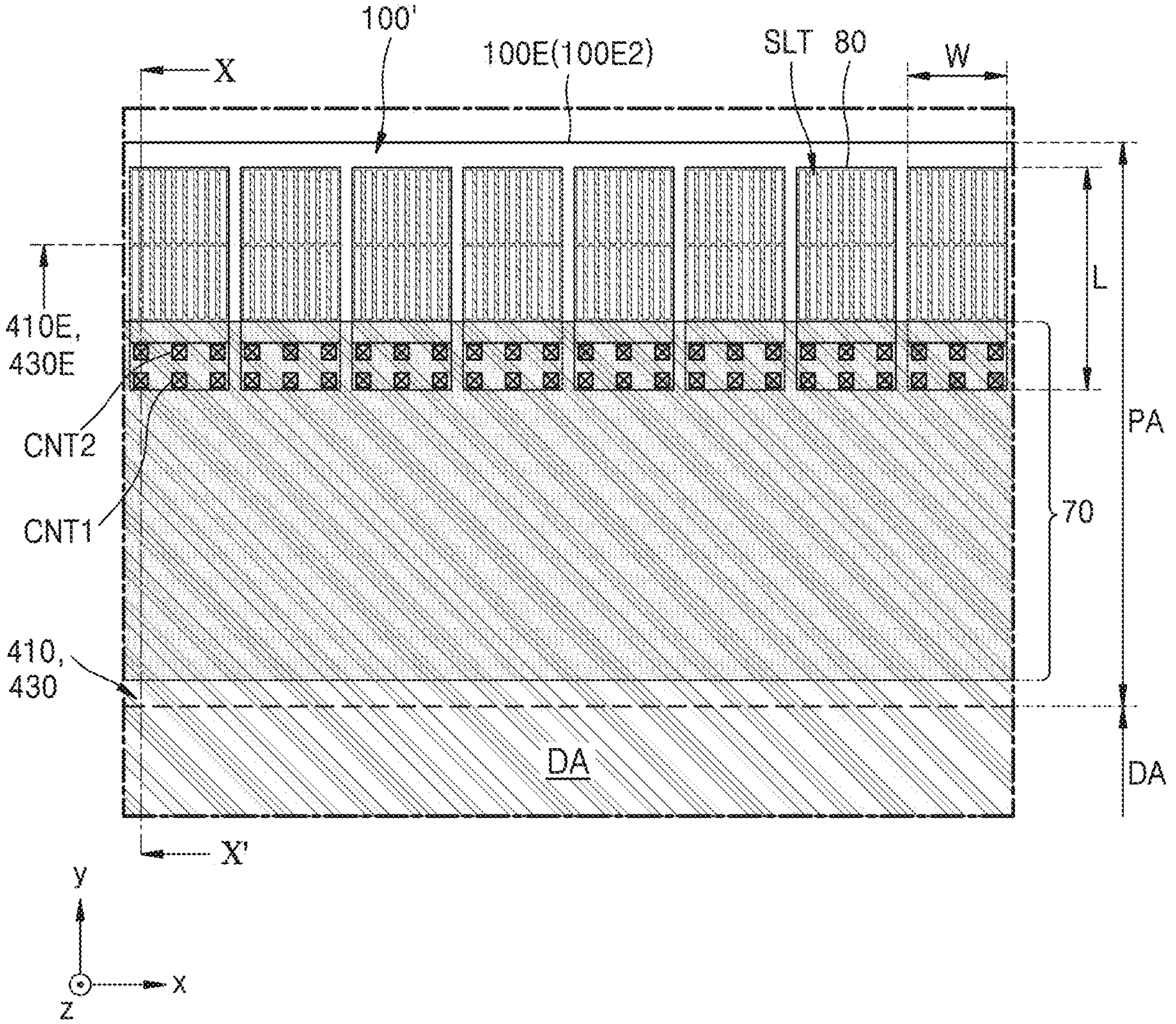
FIG. 9 is a schematic enlarged plan view showing a portion of a display apparatus according to one or more embodiments.
Figure 10:
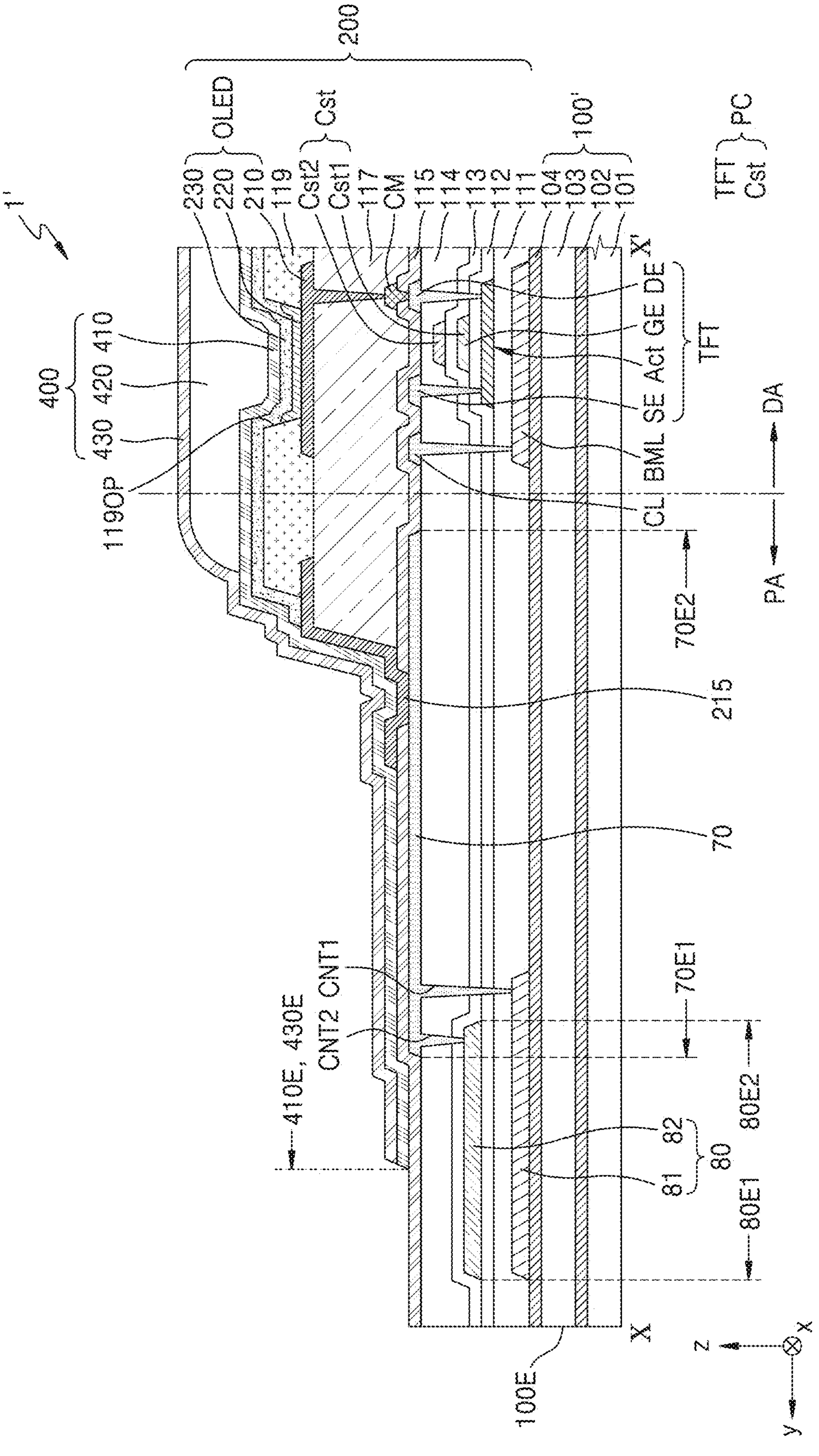
FIG. 10 is a schematic cross-sectional view of a display apparatus taken along line X-X' of FIG. 9.

FIG. 9 is a schematic enlarged plan view showing a portion of the display apparatus 1' according to one or more embodiments, and FIG. 10 is a schematic cross-sectional view of the display apparatus 1' taken along line X-X' of FIG. 9.

Referring to FIGS. 9 and 10, the display apparatus 1' may include the encapsulation layer 400 that covers the display area DA and includes at least one inorganic encapsulation layer and at least one organic encapsulation layer. In an embodiment, the encapsulation layer 400 may include the first inorganic encapsulation layer 410, the second inorganic encapsulation layer 430 and, the organic encapsulation layer 420 therebetween, which are described above with reference to FIG. 2B, and thus, redundant descriptions thereof are omitted.

In an embodiment, each of the metal patterns 80 may protrude outward (i.e., protrude an outward of the display area DA) beyond an edge of the at least one inorganic encapsulation layer, in a plan view. For example, each of the metal patterns 80 may include the inner edge 80E2 facing the display area DA and the outer edge 80E1 that is opposite to the inner edge 80E2, and the outer edge 80E1 of each of the metal patterns 80 may be arranged closer to the edges 100E of the substrate 100 than each of an edge 410E of the first inorganic encapsulation layer 410 and an edge 430E of the second inorganic encapsulation layer 430. Accordingly, the external static electricity may be preferentially induced the metal patterns 80 close to the edges 100E of the substrate 100, and may be effectively prevented from infiltrating into the display area DA through other paths.

In an embodiment, the first and second inorganic encapsulation layers 410 and 430 of the encapsulation layer 400 may extend from the display area DA to the peripheral area PA, and may cover the entirety of the common power supply layer 70, in a plan view. Accordingly, the infiltration of external foreign materials, external moisture, external air, and the like into the display area DA through the common power supply layer 70 may be reduced.

In an embodiment, the metal patterns 80 may include the first metal patterns 81 and the second metal patterns 82 that are disposed on different layers. The first metal patterns 81 may be formed in the same process as the bottom metal layer BML, may include the same material, and may be patterned to be spaced apart from the bottom metal layer BML. The second metal patterns 82 may be disposed above the first metal patterns 81. For example, the second metal patterns 82 may be formed in the same process as the gate electrode GE of the thin film transistor TFT, may include the same material, and may be patterned to be spaced apart from the gate electrode GE.

As such, as each of the metal patterns 80 includes the first metal pattern 81 and the second metal pattern 82 that are disposed on different layers, a larger number of the metal patterns 80 may be disposed in the same area, and accordingly, a static electricity prevention function by the metal patterns 80 may be improved.

The common power supply layer 70 may be electrically connected to each of the first metal patterns 81 and the second metal patterns 82. For example, the common power supply layer 70 may be electrically connected to the first metal patterns 81 via the first contact hole CNT1, and to the second metal patterns 82 via the second contact hole CNT2.

Both of the first contact hole CNT1 and the second contact hole CNT2 may be located on an inner side (i.e., closer to the display area DA) than the edge of the at least one inorganic encapsulation layer, in a plan view. For example, the first contact hole CNT1 and the second contact hole CNT2 may be located on an inner side than the edge 410E of the first inorganic encapsulation layer 410 and the edge 430E of the second inorganic encapsulation layer 430, in a plan view. Accordingly, the infiltration of external moisture, foreign materials, and external air into the display area DA through the first contact hole CNT1 and/or the second contact hole CNT2 may be reduced.

In the above-described embodiment of FIGS. 9 and 10, the metal patterns 80 are described as being disposed on different layers, but the disclosure is not limited thereto. In another embodiment, in the display apparatus 1' including the encapsulation layer 400, the metal patterns 80 may be disposed on one layer, as in the embodiment of FIGS. 6 and 7. For example, the display apparatus 1' including the encapsulation layer 400 of FIGS. 9 and 10 may be formed in the same process as the bottom metal layer BML, as in FIG. 6, and may include the metal patterns 80 disposed below the buffer layer 111, or may be formed in the same process as the gate electrode GE, as in FIG. 7 and may include the metal patterns 80 arranged between the first gate insulating layer 112 and the second gate insulating layer 113.

Figure 11:
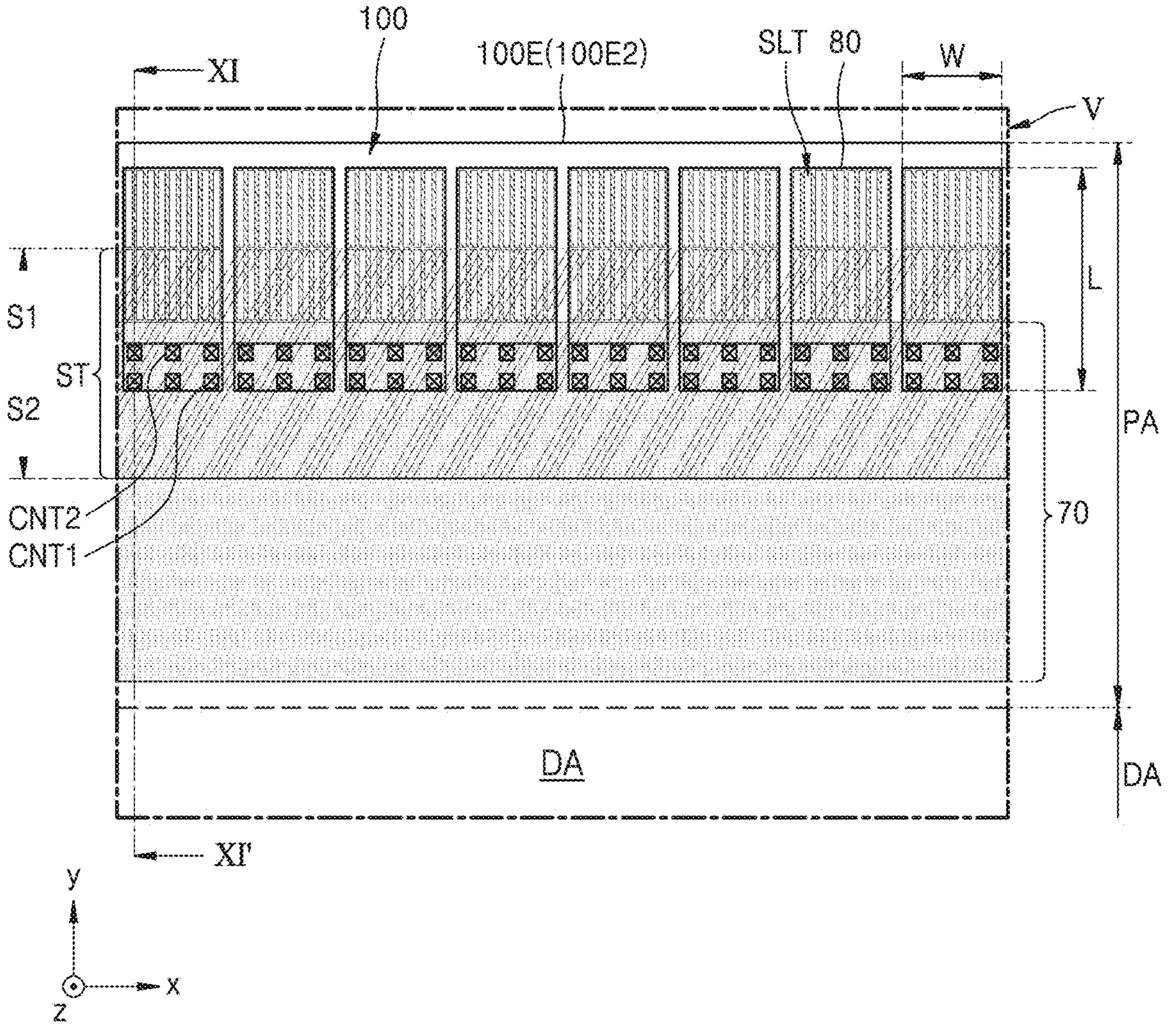
FIG. 11 is a schematic enlarged plan view showing a portion of a display apparatus according to one or more embodiments.
Figure 12:
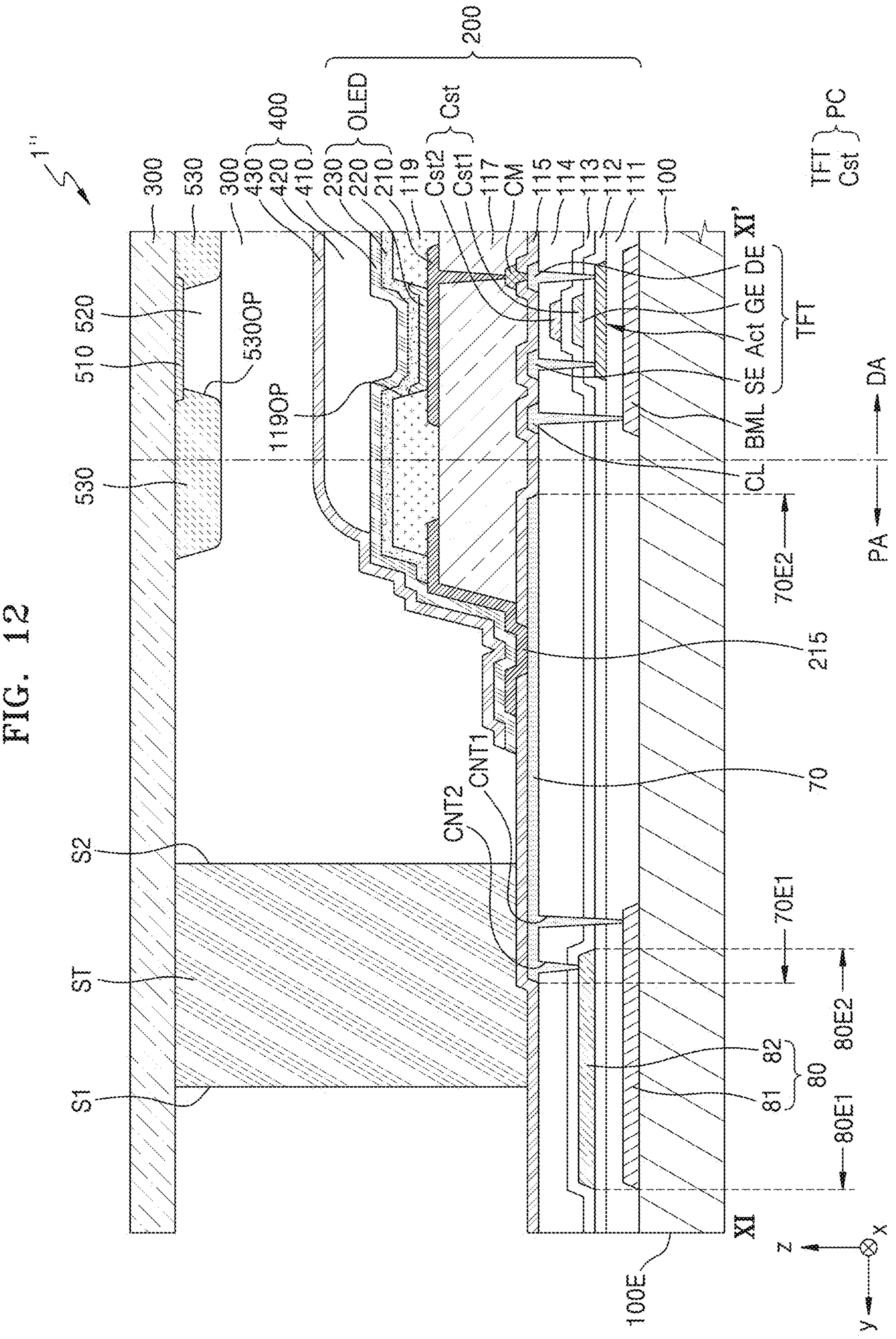
FIG. 12 is a schematic cross-sectional view of a display apparatus taken along line XI-XI' of FIG. 11.

FIG. 11 is a schematic enlarged plan view showing a portion of a display apparatus 1" according to one or more embodiments, and FIG. 12 is a schematic cross-sectional view of the display apparatus 1" taken along line XI-XI' of FIG. 11.

Referring to FIGS. 11 and 12, the display apparatus 1" may include the encapsulation substrate 300 that is arranged to face the substrate 100, and the encapsulation layer 400 that covers the display area DA and includes at least one inorganic encapsulation layer (410 and 430) and at least one organic encapsulation layer (420).

In an embodiment, the encapsulation substrate 300 may include a glass material or polymer resin, which is described above with reference to FIG. 2A, and thus, redundant descriptions thereof are omitted.

In an embodiment, a bank layer 530 in which an opening 530OP that overlaps the opening 119OP defined in the pixel defining layer 119 in a plan view is formed, a quantum-dot layer 520 located in the opening 530OP of the bank layer 530, a color filter layer 510 located between the quantum-dot layer 520 and the encapsulation substrate 300, and the like may be provided on one surface of the encapsulation substrate 300 facing the display layer 200.

In an embodiment, the quantum-dot layer 520 may convert light of a wavelength belonging to a first wavelength band passing through the quantum-dot layer 520 to light of a wavelength belonging to a second wavelength band, and the color filter layer 510 may be a layer that transmits only light that passes through the quantum-dot layer 520 and belongs to the second wavelength band. For example, the first wavelength band may be about 450 nanometers (nm) to about 495 nm, and the second wavelength band may be about 625 nm to about 780 nm. In this case, blue light emitted from the light-emitting layer, while passing through the quantum-dot layer 520, may be converted to red light of a wavelength of about 625 nm to about 780 nm, and among the light passing through the quantum-dot layer 520, only red light of a wavelength of about 625 nm to about 780 nm may pass through the color filter layer 510. The color filter layer 510 may increase the color purity of the red light emitted to the outside.

In an embodiment, the quantum-dot layer 520 may convert light of a wavelength belonging to the first wavelength band, which passes through the quantum-dot layer 520, to light of a wavelength belonging to a third wavelength band, and the color filter layer 510 may be a layer that transmits only light belonging to the third wavelength band, among the light passing through the quantum-dot layer 520. For example, the first wavelength band may be about 450 nm to about 495 nm, and the second wavelength band may be about 495 nm to about 570 nm. In this case, the blue light emitted from the light-emitting layer, while passing through the quantum-dot layer 520, may be converted to green light of a wavelength of about 495 nm to about 570 nm, and among the light passing through the quantum-dot layer 520, only the green light of a wavelength of about 495 nm to about 570 nm may pass through the color filter layer 510. The color filter layer 510 may increase the color purity of the green light emitted to the outside.

In an embodiment, while the quantum-dot layer 520 is not located in the opening 530OP of the bank layer 530, or a light transmissive layer is disposed therein instead of the quantum-dot layer 520, and the color filter layer 510 arranged between the light transmissive layer and the encapsulation substrate 300 may be a layer that transmits only light of a wavelength of the first wavelength band. For example, when the first wavelength band is about 450 nm to about 495 nm, the blue light emitted from the light-emitting layer may pass through a light transmissive layer, and only blue light of a wavelength of about 450 nm to about 495 nm among the light passing through the light transmissive layer may pass through the color filter layer 510. The color filter layer 510 may increase the color purity of the blue light emitted to the outside.

Although the above-described embodiments are various embodiments about one pixel illustrated in a cross-sectional view of FIG. 12, the display apparatus 1" of the present embodiment may include a plurality of unit pixels including all pixels of the above-described embodiments.

For example, a first pixel of one unit pixel may include a light-emitting layer that emits light of a wavelength in a first wavelength band, a first quantum-dot layer that converts the light of a wavelength in the first wavelength band emitted from the light-emitting layer to light of a wavelength in a second wavelength band, and a first color filter layer that transmits only the light of a wavelength in the second wavelength band among the light passing through the first quantum-dot layer. A second pixel of the unit pixel may include a light-emitting layer that emits the light of a wavelength in the first wavelength band, a second quantum-dot layer that converts the light of a wavelength in the first wavelength band emitted from the light-emitting layer to light of a wavelength in a third wavelength band, and a second color filter layer that transmits only the light of a wavelength in the third wavelength band among the light passing through the second quantum-dot layer. A third pixel of the unit pixel may include a light-emitting layer that emits the light of a wavelength in the first wavelength band, a light transmissive layer, and a third color filter layer that transmits only the light of a wavelength in the first wavelength band among the light passing through the light transmissive layer. For example, as light-emitting layers of first to third pixels of one unit pixel emit blue light, the blue light emitted from the light-emitting layers pass through a first quantum-dot layer, a second quantum-dot layer, and a light transmissive layer, respectively, and the light having passed through the first quantum-dot layer, the second quantum-dot layer, and the light transmissive layer pass through first to third color filter layers, respectively, first to third pixels may emit red light, green light, and blue light, respectively. Accordingly, the unit pixel may emit white light. The light-emitting layer included in the intermediate layer 220 may be patterned to separately correspond to each opening 119OP defined in the pixel defining layer 119, or may be integrally formed to entirely overlap the pixel electrodes 210 in a plan view.

In an embodiment, the first and second inorganic encapsulation layers 410 and 430 of the encapsulation layer 400 may extend from the display area DA to the peripheral area PA. Unlike the display apparatus 1' of the embodiment of FIG. 10, the first and second inorganic encapsulation layers 410 and 430 according to the present embodiment may overlap a part of the common power supply layer 70, in a plan view, and may not cover the entirety of the common power supply layer 70.

The sealant ST may be disposed between the substrate 100 and the encapsulation substrate 300. The sealant ST may be located in the peripheral area PA, may be interposed between the substrate 100 and the encapsulation substrate 300, and may be arranged apart from the first and second inorganic encapsulation layers 410 and 430 of the encapsulation layer 400, in a plan view. The sealant ST may bond the substrate 100 and the encapsulation substrate 300 to each other. The sealant ST may entirely surround the display layer 200. For example, when viewed from a direction perpendicular to an upper surface of the substrate 100, that is, in a plan view, the display area DA may be entirely surrounded by the sealant ST.

In an embodiment, each of the metal patterns 80 may protrude outward (i.e., protrude an outward of the display area DA) beyond the edge of the sealant ST, in a plan view. For example, each of the metal patterns 80 may include the inner edge 80E2 facing the display area DA and the outer edge 80E1 that is opposite to the inner edge 80E2, and the outer edge 80E1 of each of the metal patterns 80 may be arranged closer to the edges 100E of the substrate 100 than the outer surface S1 of the sealant ST. Accordingly, external static electricity may be preferentially induced to the metal patterns 80 close to the edges 100E of the substrate 100, and may be prevented from flowing into the display area DA through other paths.

In an embodiment, the metal patterns 80 may include the first metal patterns 81 and the second metal patterns 82 that are disposed on different layers, which is described above with reference to FIG. 8, and thus, redundant descriptions thereof are omitted.

The common power supply layer 70 may be electrically connected to each of the first metal patterns 81 and the second metal patterns 82 via the first contact hole CNT1 and the second contact hole CNT2, respectively.

Both of the first contact hole CNT1 and the second contact hole CNT2 may be located on an inner side (i.e., closer to the display area DA) than the outer surface S1 of the sealant ST, in a plan view. Furthermore, the edge of the common power supply layer 70 may be located on an inner side than the outer surface S1 of the sealant ST, in a plan view. For example, the common power supply layer 70 may include the inner edge 70E2 facing the display area DA and the outer edge 70E1 that is opposite to the inner edge 70E2, and both of the outer edge 70E1 and the inner edge 70E2 of the common power supply layer 70 may be located on an inner side (i.e., closer to the display area DA) than the outer surface S1 of the sealant ST. As such, as no portion of the first contact hole CNT1 and the common power supply layer 70 is arranged on an outer side (i.e., reach farther from the display area DA) than the sealant ST, in a plan view, the common power supply layer 70 and the first contact hole CNT1 may be effectively protected by the sealant ST, and accordingly, infiltration of external foreign materials, external moisture, external air, and the like into the display area DA through the common power supply layer 70 and the first contact hole CNT1 may be reduced.

Figure 13:
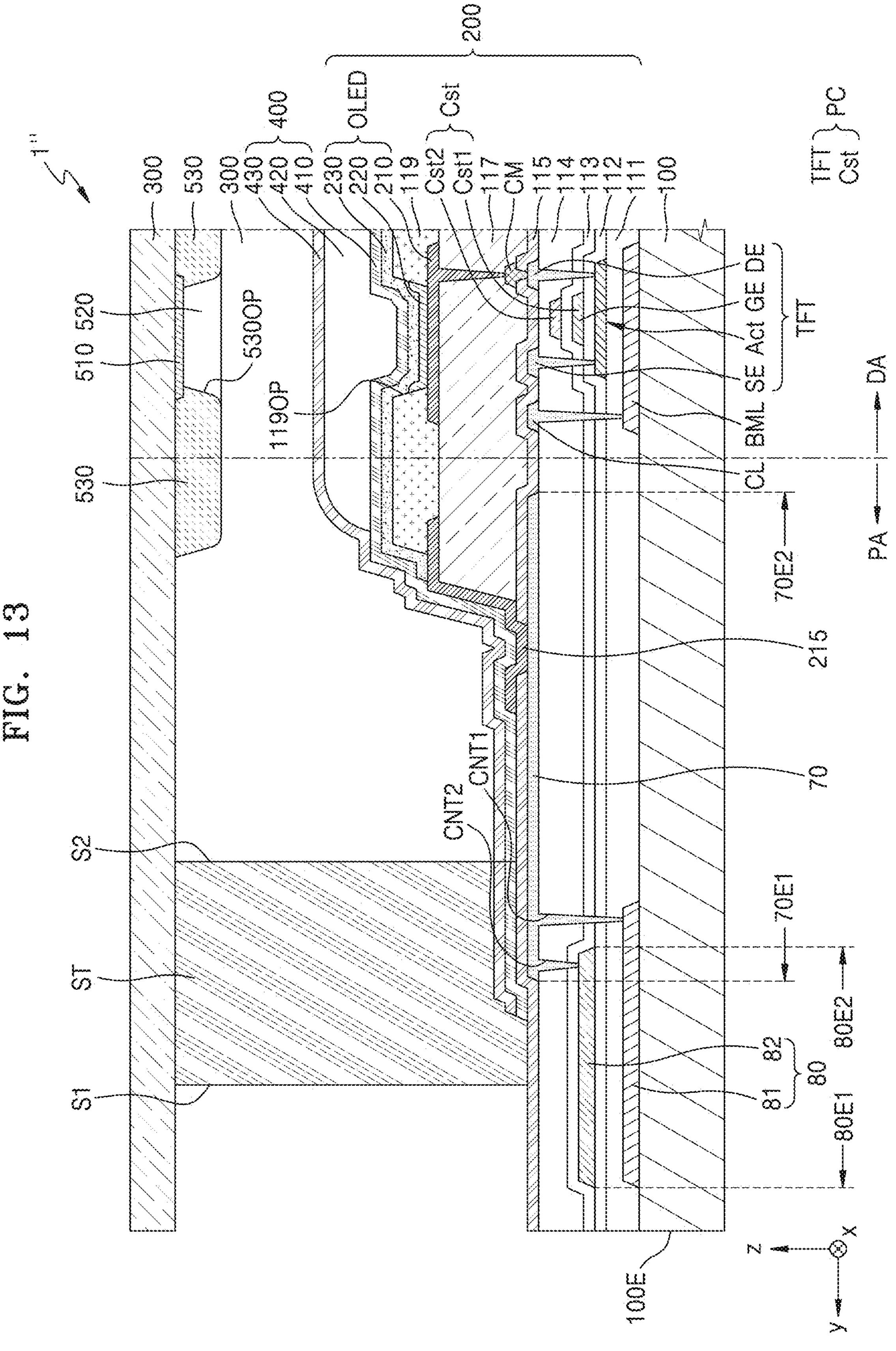
FIG. 13 is a schematic cross-sectional of a portion of a display apparatus according to one or more embodiments.

FIG. 13 shows a modified embodiment of FIG. 12, and thus, redundant descriptions in the drawings are omitted and only differences therebetween are presented below.

Compared with the embodiment of FIG. 12, the first and second inorganic encapsulation layers 410 and 430 of the encapsulation layer 400 may extend further toward the sealant ST to overlap the sealant ST in a plan view. For example, the first and second inorganic encapsulation layers 410 and 430 may cover the entirety of the common power supply layer 70, in a plan view. Accordingly, both of the outer edge 70E1 and the inner edge 70E2 of the common power supply layer 70 may be located on an inner side (i.e., closer to the display area DA) than both the outer surface S1 of the sealant ST and the edges of the first and second inorganic encapsulation layers 410 and 430. By double covering the first contact hole CNT1 and/or the second contact hole CNT2 with the first and second inorganic encapsulation layers 410 and 430 and the sealant ST, the infiltration of external moisture, foreign materials, and external air into the display area DA through the first contact hole CNT1 and/or the second contact hole CNT2 may be effectively reduced.

In the above-described embodiments of FIGS. 12 and 13, the metal patterns 80 are described as being arranged on different layers, but the disclosure is not limited thereto. In another embodiment, like the embodiments of FIGS. 6 and 7, the metal patterns 80 may be arranged on one layer. For example, the display apparatus 1' of FIGS. 12 and 13 may include the metal patterns 80 that are formed in the same process as the bottom metal layer BML and arranged below the buffer layer 111, as illustrated in FIG. 6, or the metal patterns 80 that are formed in the same process as the gate electrode GE and arranged between the first gate insulating layer 112 and the second gate insulating layer 113, as illustrated in FIG. 7.

In the above-described embodiments of FIGS. 12 and 13, the upper surface of the sealant ST is described as being in direct contact with the encapsulation substrate 300, but in other embodiments, various modifications are possible such that the bank layer 530 may extend to the sealant ST to partially overlap the sealant ST, or the quantum-dot layer 520 and/or the color filter layer 510 may extend to the sealant ST to partially overlap the sealant ST in a plan view.

Although only a display apparatus is mainly described above, the disclosure is not limited thereto. For example, a method of manufacturing a display apparatus also falls within the scope of the present invention.

According to an embodiment described above, as a plurality of metal patterns electrically connected to a common power supply layer is provided, a display apparatus capable of effectively discharging or distributing static electricity may be implemented.

According to an embodiment described above, as a plurality of metal patterns electrically connected to a common power supply layer is provided, a display apparatus capable of effectively discharging or distributing static electricity may be implemented. The scope of the disclosure is not limited by the above effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus including a display area and a peripheral area located outside the display area, the display apparatus comprising:

a substrate;

a plurality of first metal patterns arranged on the substrate along an edge of the substrate and arranged apart from each other in the peripheral area;

a first insulating layer disposed on the plurality of first metal patterns;

a plurality of second metal patterns arranged on the first insulating layer in the peripheral area, at least a portion of which overlaps with the plurality of first metal patterns in a plan view and a cross-sectional view;

a second insulating layer disposed on the plurality of second metal patterns; and a common power supply layer disposed on the second insulating layer in the peripheral area, electrically connected to the plurality of first metal patterns via a first contact hole defined in the first and second insulating layers, and electrically connected to the plurality of second metal patterns via a second contact hole defined in the second insulating layer, wherein the plurality of first metal patterns and the plurality of second metal patterns rather than the common power supply layer is arranged closer to the edge of the substrate.

2. The display apparatus of claim 1, wherein each of the plurality of first metal patterns includes a plurality of slits.

3. The display apparatus of claim 1, wherein each of the plurality of first metal patterns has a width along the edge of the substrate and a length along a direction crossing the edge, and the length of each of the plurality of first metal patterns is greater than the width thereof.

4. The display apparatus of claim 1, wherein, in a plan view, the plurality of first metal patterns surrounds at least part of the display area.

5. The display apparatus of claim 1, further comprising:

a thin film transistor disposed on the substrate in the display area and comprising a semiconductor layer and a gate electrode overlapping the semiconductor layer; and a bottom metal layer interposed between the substrate and the thin film transistor.

6. The display apparatus of claim 5, wherein the plurality of first metal patterns are arranged apart from each other in a same layer as the bottom metal layer, and comprise a same material as the bottom metal layer.

7. The display apparatus of claim 5, wherein the plurality of first metal patterns are arranged apart from each other in a same layer as the gate electrode, and comprise a same material as the gate electrode.

8. The display apparatus of claim 5, wherein the plurality of first metal patterns are arranged apart from each other in a same layer as the bottom metal layer and comprise a same material as the bottom metal layer, and the plurality of second metal patterns are arranged apart from each other in a same layer as the gate electrode and comprise a same material as the gate electrode.

9. The display apparatus of claim 1, further comprising:

a pixel electrode disposed on the substrate and located in the display area;

a counter electrode on the pixel electrode; and an intermediate layer between the pixel electrode and the counter electrode, wherein the counter electrode is electrically connected to the common power supply layer, and the first and second insulating layers comprise an inorganic insulating material.

10. The display apparatus of claim 1, further comprising:

an encapsulation substrate arranged to face the substrate; and a sealant located in the peripheral area, interposed between the substrate and the encapsulation substrate, and including an inner surface facing the display area and an outer surface that is opposite to the inner surface.

11. The display apparatus of claim 10, wherein each of the plurality of first metal patterns protrudes outward beyond the outer surface of the sealant in a plan view.

12. The display apparatus of claim 10, wherein, in a plan view, the first contact hole is located closer to the display area than the outer surface of the sealant.

13. The display apparatus of claim 10, wherein, in a plan view, an edge of the common power supply layer is located closer to the display area than the outer surface of the sealant.

14. The display apparatus of claim 10, wherein in a plan view, the second contact hole is located closer to the display area than the outer surface of the sealant.

15. The display apparatus of claim 1, further comprising an encapsulation layer covering the display area and comprising at least one inorganic encapsulation layer and at least one organic encapsulation layer.

16. The display apparatus of claim 15, wherein, in a plan view, each of the plurality of first metal patterns protrudes outward beyond an edge of the at least one inorganic encapsulation layer.

17. The display apparatus of claim 15, wherein, in a plan view, the at least one inorganic encapsulation layer of the encapsulation layer extends from the display area to the peripheral area and covers an entirety of the common power supply layer.

18. The display apparatus of claim 15, wherein, in a plan view, the first contact hole is located closer to the display area than an edge of the at least one inorganic encapsulation layer.

19. The display apparatus of claim 15, wherein in a plan view, the second contact hole is located closer to the display area than an edge of the at least one inorganic encapsulation layer.

20. The display apparatus of claim 1, further comprising:

an organic light-emitting device disposed on the substrate and comprising a pixel electrode, a counter electrode on the pixel electrode, and an intermediate layer between the pixel electrode and the counter electrode;

an encapsulation layer covering the organic light-emitting device and comprising at least one inorganic encapsulation layer and at least one organic encapsulation layer;

an encapsulation substrate arranged to face the substrate;

a quantum-dot layer on one surface of the encapsulation substrate to face the pixel electrode; and a sealant located in the peripheral area, interposed between the substrate and the encapsulation substrate, and comprising an inner surface facing the display area and an outer surface that is opposite to the inner surface.

21. The display apparatus of claim 20, wherein the at least one inorganic encapsulation layer is located closer to the display area than the sealant to be apart from the sealant, and each of the plurality of first metal patterns protrudes outward beyond the outer surface of the sealant, in a plan view.

22. The display apparatus of claim 20, wherein, in a plan view, an edge of the common power supply layer is located closer to the display area than the outer surface of the sealant, and located farther from the display area than an edge of the at least one inorganic encapsulation layer.

23. The display apparatus of claim 20, wherein an edge of the common power supply layer is located closer to the display area than the outer surface of the sealant, and located closer to the display area than an edge of the at least one inorganic encapsulation layer.

24. A display apparatus comprising:

a substrate comprising a plurality of pixels;

a plurality of first metal patterns arranged apart from each other on the substrate along an edge of the substrate;

a common power supply layer electrically connected to the plurality of first metal patterns via a first contact hole and which applies a constant voltage to the plurality of pixels;

an encapsulation substrate arranged to face the substrate; and a sealant disposed between the substrate and the encapsulation substrate to surround the plurality of pixels, and including an outer surface close to an edge of the substrate and an inner surface close to the plurality of pixels, wherein end portions of the first metal patterns are arranged to be closer to the edge of the substrate than an outer surface of the sealant, and the first contact hole is disposed between the outer surface and the inner surface of the sealant.

* * * * *